United States Patent
Chiu

(10) Patent No.: US 12,283,567 B2
(45) Date of Patent: *Apr. 22, 2025

(54) METHOD OF MANUFACTURING SEMICONDUCTOR DEVICE HAVING AIR CAVITY

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/604,804

(22) Filed: Mar. 14, 2024

(65) Prior Publication Data

US 2024/0222317 A1 Jul. 4, 2024

Related U.S. Application Data

(62) Division of application No. 17/715,272, filed on Apr. 7, 2022, now Pat. No. 12,148,731.

(51) Int. Cl.
*H01L 23/00* (2006.01)

(52) U.S. Cl.
CPC .... *H01L 24/82* (2013.01); *H01L 2224/82002* (2013.01); *H01L 2224/82101* (2013.01); *H01L 2224/82106* (2013.01)

(58) Field of Classification Search
CPC .......... H01L 24/82; H01L 2224/82002; H01L 2224/82005; H01L 2224/82106
USPC ....................................................... 438/622
See application file for complete search history.

(56) References Cited

U.S. PATENT DOCUMENTS

| | | | |
|---|---|---|---|
| 6,277,705 B1 | 8/2001 | Lee | |
| 2002/0158337 A1* | 10/2002 | Babich | H01L 21/7681 257/750 |
| 2004/0097065 A1* | 5/2004 | Lur | H01L 21/7682 438/619 |
| 2011/0021036 A1* | 1/2011 | Braecklmann | H01L 21/7682 257/E21.259 |
| 2011/0278654 A1 | 11/2011 | Ueda | |
| 2017/0287784 A1* | 10/2017 | Leobandung | H01L 21/0217 |
| 2018/0047616 A1* | 2/2018 | Reber | H01L 21/76834 |
| 2019/0122919 A1* | 4/2019 | Hong | H01L 21/76879 |
| 2021/0098292 A1* | 4/2021 | Nguyen | H01L 21/02126 |
| 2021/0272907 A1 | 9/2021 | Wang et al. | |

OTHER PUBLICATIONS

Office Action with the search report mailed on Apr. 25, 2024 related to U.S. Appl. No. 17/715,272.
Office Action and and the search report mailed on Nov. 25, 2024 related to U.S. Appl. No. 17/715,215.

* cited by examiner

*Primary Examiner* — Didarul A Mazumder
(74) *Attorney, Agent, or Firm* — Xuan Zhang

(57) ABSTRACT

The present disclosure provides a method of manufacturing a semiconductor device. The method includes providing an interconnection structure. The method also includes forming a first dielectric layer on the interconnection structure. The method further includes forming a sacrificial pattern on the first dielectric layer. The method also includes forming an RDL on the first dielectric layer and the sacrificial pattern. The method further includes removing the sacrificial pattern to form an air cavity within the RDL.

12 Claims, 20 Drawing Sheets

METHOD OF MANUFACTURING SEMICONDUCTOR DEVICE HAVING AIR CAVITY

CROSS-REFERENCE TO RELATED APPLICATION

This application is a divisional application of U.S. Non-Provisional application Ser. No. 17/715,272 filed Apr. 7, 2022, which is incorporated herein by reference in its entirety.

TECHNICAL FIELD

The present disclosure relates to a method of manufacturing a semiconductor device, and more particularly, to a method of manufacturing a semiconductor device having an air cavity.

DISCUSSION OF THE BACKGROUND

With the rapid growth of electronic industry, the development of semiconductor devices has achieved high performance and miniaturization. As the size of semiconductor devices shrinks, parasitic capacitance within the semiconductor devices has become crucial to operation performance. To deal with such problem, metal routings may be shortened to reduce the parasitic capacitance.

However, although the parasitic capacitance may be reduced, the changes in metal routings may adversely affect the operation performance of the semiconductor devices.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a first patterned conductive layer, a first dielectric layer, and a second patterned conductive layer. The first patterned conductive layer is on the substrate. The first dielectric layer is on the first patterned conductive layer. The second patterned conductive layer is on the first dielectric layer. The semiconductor device has an air cavity between the first patterned conductive layer and the second patterned conductive layer.

Another aspect of the present disclosure provides a semiconductor device. The semiconductor device includes an interconnection structure, a first dielectric layer, and a redistribution layer (RDL). The interconnection structure includes a top patterned conductive layer. The first dielectric layer is on the top patterned conductive layer. The RDL is on the first dielectric layer. The semiconductor device has an air gap between the RDL and the interconnection structure.

Another aspect of the present disclosure provides a method of manufacturing a semiconductor device. The method includes providing an interconnection structure. The method also includes forming a first dielectric layer on the interconnection structure. The method further includes forming a sacrificial pattern on the first dielectric layer. The method also includes forming an RDL on the first dielectric layer and the sacrificial pattern. The method further includes removing the sacrificial pattern to form an air cavity within the RDL.

In the semiconductor device, with the design of the air cavity, the parasitic capacitance resulted from the interconnection structure, the dielectric layer, and the patterned conductive layer (or the RDL) can be significantly reduced, and thus the operation performance of the semiconductor device can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
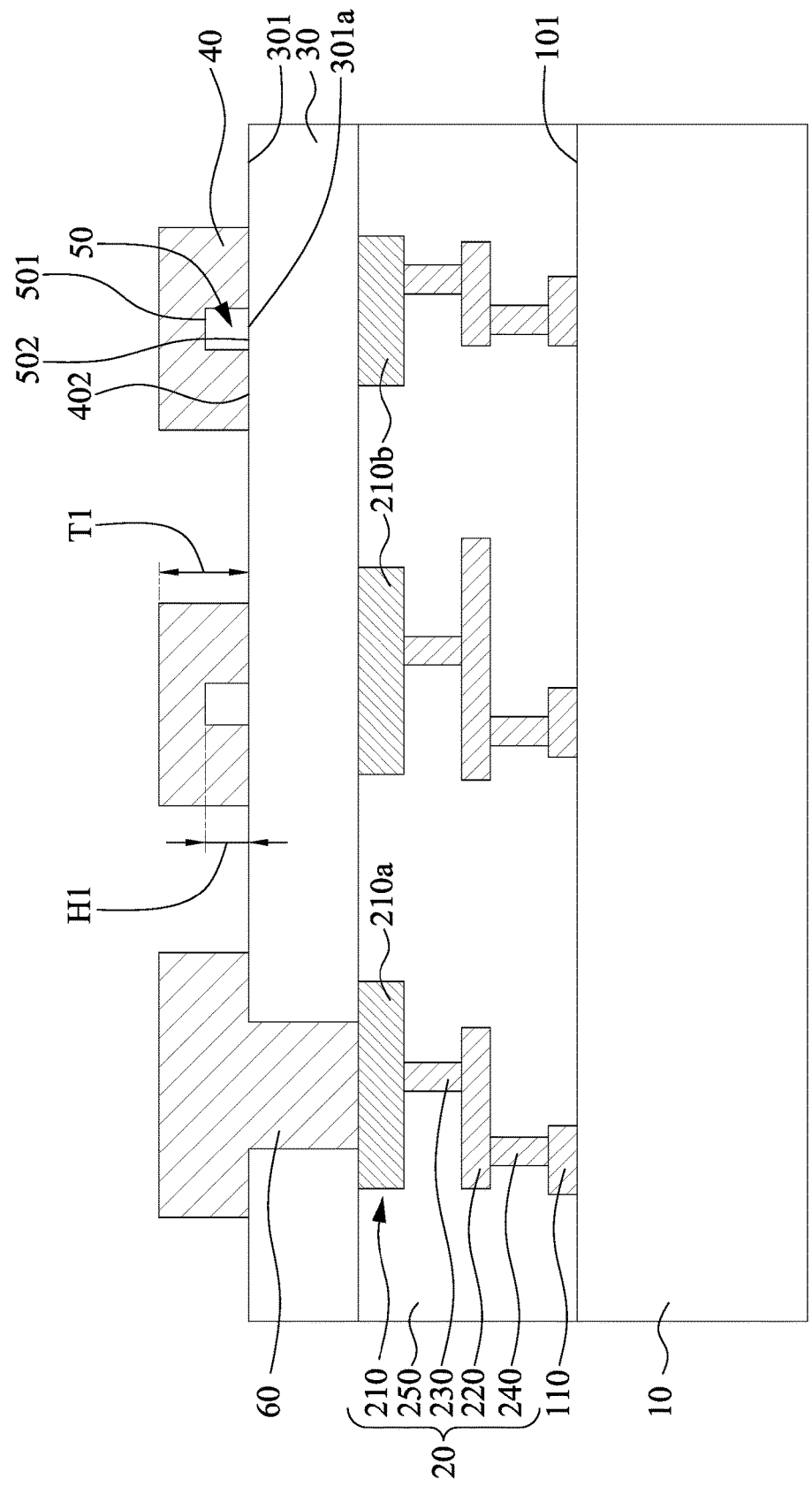
FIG. 1 is a cross-sectional view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor device 1, in accordance with some embodiments of the present disclosure. The semiconductor device 1 includes a substrate 10, an interconnection structure 20, a dielectric layer 30, a patterned conductive layer 40, an air cavity 50, and a contact structure 60.

The substrate 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

In some embodiments, the substrate 10 includes one or more integrated circuits. The integrated circuit may include one or more MOS devices, one or more flash memory cells, or any combination thereof. In some embodiments, the substrate 10 has a surface 101 (also referred to as "an upper surface"). In some embodiments, the substrate 10 includes conductive pads 110 adjacent to the surface 110. The conductive pads 110 may be on the surface 110 of the substrate 10. In some embodiments, the conductive pads 110 serve to electrically connect the integrated circuits of the substrate 10 to the interconnection structure 20. The conductive pads 110 may be formed of, for example, copper, nickel, cobalt, aluminum, tungsten, or any combination thereof.

The interconnection structure 20 may be disposed or formed on the substrate 10. In some embodiments, the interconnection structure 20 includes a patterned conductive layer 210 (also referred to as "a top patterned conductive layer"), a patterned conductive layer 220, conductive vias 230 and 240, and a dielectric layer 250. In some embodiments, the patterned conductive layers 210 and 220 and the conductive vias 230 and 240 are formed within or embedded in the dielectric layer 250.

In some embodiments, the patterned conductive layer 210 is the topmost patterned conductive layer of the interconnection structure 20. The patterned conductive layer 210 may serve to electrically connect to a redistribution layer (RDL) (e.g., the patterned conductive layer 40). In some embodiments, the patterned conductive layer 210 includes a connection portion 210a and a routing portion 210b. In some embodiments, the connection portion 210a directly connects or directly contacts the routing portion 210b. In some embodiments, the connection portion 210a of the patterned conductive layer 210 serves to electrically connect to an RDL (e.g., the patterned conductive layer 40).

In some embodiments, the patterned conductive layer 210 is electrically connected to the patterned conductive layer 220 through the conductive via 230. In some embodiments, the patterned conductive layer 220 is electrically connected to the conductive pad 110 through the conductive via 240. In some embodiments, the patterned conductive layers 210 and 220 and the conductive vias 230 and 240 may be formed or include aluminum, copper, tungsten, cobalt, or an alloy thereof. The number of the patterned conductive layers and the conductive vias of the interconnection structure 20 may vary according to actual applications and is not limited thereto.

The dielectric layer 30 may be disposed or formed on the interconnection structure 20. In some embodiments, the dielectric layer 30 is be disposed or formed on the patterned conductive layer 210. In some embodiments, the dielectric layer 30 directly contacts the patterned conductive layer 210. In some embodiments, the dielectric layer 30 may be formed of or include an insulating material such as silicon oxide, silicon nitride, silicon oxynitride, or a combination thereof.

The patterned conductive layer 40 may be disposed or formed on the dielectric layer 30. In some embodiments, the patterned conductive layer 40 is disposed or formed on a surface 301 (also referred to as "an upper surface") of the dielectric layer 30. In some embodiments, the patterned conductive layer 40 may be an RDL. In some embodiments, a thickness T1 of the patterned conductive layer 40 may be equal to or greater than about 0.8 μm. In some embodiments, the thickness T1 of the patterned conductive layer 40 may be from about 0.8 μm to about 1 μm. In some embodiments, the patterned conductive layer 40 may be formed or include aluminum, copper, tungsten, cobalt, nickel, gold, or an alloy thereof.

The air cavity 50 (also referred to as "an air gap") may be formed or located between the interconnection structure 20 and the patterned conductive layer 40. In some embodiments, the air cavity 50 is between the patterned conductive layer 210 and the patterned conductive layer 40. In some embodiments, the air cavity 50 is between the patterned conductive layer 40 and the dielectric layer 30.

In some embodiments, the air cavity 50 is within the patterned conductive layer 40. In some embodiments, a portion (e.g., surface 301) of the dielectric layer 30 is exposed to the air cavity 50. In some embodiments, a portion 301a of the surface 301 of the dielectric layer 30 is exposed to the air cavity 50. In some embodiments, the air cavity 50 is defined by the patterned conductive layer 40 and the surface 301 of the dielectric layer 30. In some embodiments, the air cavity 50 is defined by the patterned conductive layer 40 and a portion 301a of the surface 301 of the dielectric layer 30. In some embodiments, a surface 501 (also referred to as "a top surface") of the air cavity 50 is defined by the patterned conductive layer 40. In some embodiments, a surface 502 (also referred to as "a bottom surface") of the air cavity 50 and a surface 402 (also referred to as "a bottom surface") of the patterned conductive layer 40 are at substantially the same elevation.

In some embodiments, a height H1 of the air cavity 50 is equal to or greater than about 2000 Å. In some embodiments, the height H1 of the air cavity 50 is from about 2000 Å to about 2500 Å. In some embodiments, a ratio of the height H1 of the air cavity 50 to the thickness T1 of the patterned conductive layer 40 is equal to or greater than about 0.25. In some embodiments, the ratio of the height H1 of the air cavity 50 to the thickness T1 of the patterned conductive layer 40 is from about 0.25 to about 0.5.

The contact structure 60 may electrical connect the interconnection structure 20 and the patterned conductive layer 40. In some embodiments, the contact structure 60 electrically connects the patterned conductive layer 210 and the patterned conductive layer 40. In some embodiments, the contact structure 60 passes through or penetrates the dielectric layer 30. In some embodiments, the contact structure 60 is free from overlapping the air cavity 50 from a top view perspective. In some embodiments, the contact structure 60 may be formed or include aluminum, copper, tungsten, cobalt, nickel, gold, or an alloy thereof.

According to some embodiments of the present disclosure, with the design of the air cavity 50, the parasitic capacitance resulted from the interconnection structure 20, the dielectric layer 30, and the patterned conductive layer 40 (or the RDL) can be significantly reduced, and thus the operation performance of the semiconductor device 1 can be improved.

In addition, according to some embodiments of the present disclosure, the air cavity 50 is formed within the patterned conductive layer 40 (or the RDL), and thus the parasitic capacitance can be reduced by changing the volume and/or the location of the air cavity 50 according to actual requirements without changing or modifying the routing pattern (e.g., the arrangements of the patterned conductive layer 210 and the contact structure 60) of the semiconductor device 1. Therefore, the routing pattern can follow the original routing design rule regardless the design of the air cavity 50, and thus the parasitic capacitance can be reduced without changing or adjusting the routing design rule. Therefore, the operation performance of the semiconductor device 1 can be prevented from being adversely affected.

Moreover, according to some embodiments of the present disclosure, with the design of the ratio of the height H1 of the air cavity 50 to the thickness T1 of the patterned conductive layer 40, the thickness (which corresponds to or substantially equals to the height H1 of the air cavity 50) of a sacrificial pattern (e.g., a pattern 520 which will be described in details hereinafter) for forming the air cavity 50 is sufficiently thick to prevent it from peeling off. In addition, the as-formed patterned conductive layer 40 can also have a sufficient thickness above the air cavity 50 so as to provide satisfactory electrical connection performance.

Figure 2A:
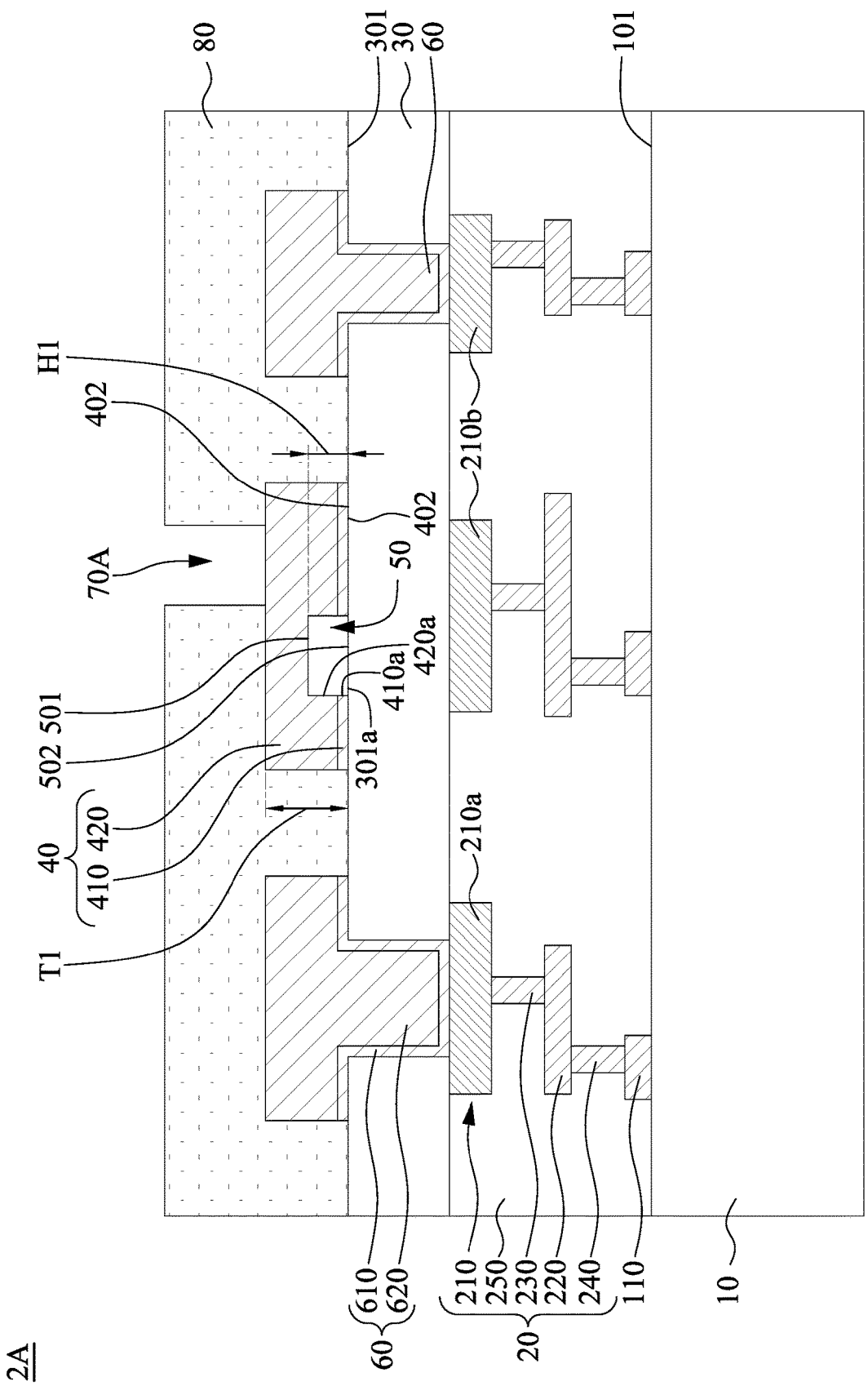
FIG. 2A is a cross-sectional view of a semiconductor device, in accordance with some embodiments of the present disclosure.

FIG. 2A is a cross-sectional view of a semiconductor device 2A, in accordance with some embodiments of the present disclosure. The semiconductor device 2A includes a substrate 10, an interconnection structure 20, dielectric layers 30 and 80, a patterned conductive layer 40, an air cavity 50, and a contact structure 60.

The substrate 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

In some embodiments, the substrate 10 includes one or more integrated circuits. The integrated circuit may include one or more MOS devices, one or more flash memory cells, or any combination thereof. In some embodiments, the substrate 10 has a surface 101 (also referred to as "an upper surface"). In some embodiments, the substrate 10 includes conductive pads 110 adjacent to the surface 110. The conductive pads 110 may be on the surface 110 of the substrate 10. In some embodiments, the conductive pads 110 serve to electrically connect the integrated circuits of the substrate 10 to the interconnection structure 20. The conductive pads 110 may be formed of, for example, copper, nickel, cobalt, aluminum, tungsten, or any combination thereof.

The interconnection structure 20 may be disposed or formed on the substrate 10. In some embodiments, the interconnection structure 20 includes a patterned conductive layer 210 (also referred to as "a top patterned conductive layer), a patterned conductive layer 220, conductive vias 230 and 240, and a dielectric layer 250. In some embodiments, the patterned conductive layers 210 and 220 and the conductive vias 230 and 240 are formed within or embedded in the dielectric layer 250.

In some embodiments, the patterned conductive layer 210 is the topmost patterned conductive layer of the interconnection structure 20. The patterned conductive layer 210 may serve to electrically connect to a redistribution layer (RDL) (e.g., the patterned conductive layer 40). In some embodiments, the patterned conductive layer 210 includes a connection portion 210a and a routing portion 210b. In some embodiments, the connection portion 210a directly connects or directly contacts the routing portion 210b. In some embodiments, the connection portion 210a of the patterned conductive layer 210 serves to electrically connect to an RDL (e.g., the patterned conductive layer 40).

In some embodiments, the patterned conductive layer 210 is electrically connected to the patterned conductive layer 220 through the conductive via 230. In some embodiments, the patterned conductive layer 220 is electrically connected to the conductive pad 110 through the conductive via 240. In some embodiments, the patterned conductive layers 210 and 220 and the conductive vias 230 and 240 may be formed or include aluminum, copper, tungsten, cobalt, or an alloy thereof. The number of the patterned conductive layers and the conductive vias of the interconnection structure 20 may vary according to actual applications and is not limited thereto.

The dielectric layer 30 may be disposed or formed on the interconnection structure 20. In some embodiments, the dielectric layer 30 is be disposed or formed on the patterned conductive layer 210. In some embodiments, the dielectric layer 30 directly contacts the patterned conductive layer 210. In some embodiments, the dielectric layer 30 may be formed of or include an insulating material such as silicon oxide, silicon nitride, silicon oxynitride, or a combination thereof.

The patterned conductive layer 40 may be disposed or formed on the dielectric layer 30. In some embodiments, the patterned conductive layer 40 is disposed or formed on a surface 301 (also referred to as "an upper surface") of the dielectric layer 30. In some embodiments, the patterned conductive layer 40 may be an RDL. In some embodiments, a thickness T1 of the patterned conductive layer 40 may be equal to or greater than about 0.8 μm. In some embodiments, the thickness T1 of the patterned conductive layer 40 may be from about 0.8 μm to about 1 μm.

In some embodiments, the patterned conductive layer 40 includes a seed layer 410 and a conductive layer 420. In some embodiments, the seed layer 410 is disposed or formed on the surface 301 of the dielectric layer 30, and the conductive layer 420 is formed on the seed layer 410. In some embodiments, the seed layer 410 may be formed or include titanium, copper, or an alloy thereof, or any combination thereof. In some embodiments, the conductive layer 420 may be formed or include aluminum, copper, tungsten, cobalt, nickel, gold, or an alloy thereof.

The air cavity 50 (also referred to as "an air gap") may be formed or located between the interconnection structure 20 and the patterned conductive layer 40. In some embodiments, the air cavity 50 is between the patterned conductive layer 210 and the patterned conductive layer 40. In some embodiments, the air cavity 50 is between the patterned conductive layer 40 and the dielectric layer 30.

In some embodiments, the air cavity 50 is within the patterned conductive layer 40. In some embodiments, a portion (e.g., surface 301) of the dielectric layer 30 is exposed to the air cavity 50. In some embodiments, a portion 301a of the surface 301 of the dielectric layer 30 is exposed to the air cavity 50. In some embodiments, the air cavity 50 is defined by the patterned conductive layer 40 and the surface 301 of the dielectric layer 30. In some embodiments, the air cavity 50 is defined by the patterned conductive layer 40 and a portion 301a of the surface 301 of the dielectric layer 30. In some embodiments, a surface 502 (also referred to as "a bottom surface) of the air gap 50 and a surface 402 (also referred to as "a bottom surface") of the patterned conductive layer 40 are at substantially the same elevation.

In some embodiments, a portion of the seed layer 410 is exposed to the air cavity 50. In some embodiments, a surface 410a of the seed layer 410 is exposed to the air cavity 50. In some embodiments, a portion of the conductive layer 420 is exposed to the air cavity 50. In some embodiments, a surface 420a of the conductive layer 420 is exposed to the air cavity 50. In some embodiments, the air cavity 50 is defined by the seed layer 410, the conductive layer 420, and the surface 301 of the dielectric layer 30. In some embodiments, the air cavity 50 is defined by the surface 410a of the seed layer 410, the surface 420a of the conductive layer 420, and a portion 301a of the surface 301 of the dielectric layer 30.

In some embodiments, a height H1 of the air cavity 50 is equal to or greater than about 2000 Å. In some embodiments, the height H1 of the air cavity 50 is from about 2000 Å to about 2500 Å. In some embodiments, a ratio of the height H1 of the air cavity 50 to the thickness T1 of the patterned conductive layer 40 (i.e., the sum of the thickness of the seed layer 410 and the thickness of the conductive layer 420) is equal to or greater than about 0.25. In some embodiments, the ratio of the height H1 of the air cavity 50 to the thickness T1 of the patterned conductive layer 40 is from about 0.25 to about 0.5.

The contact structure 60 may electrical connect the interconnection structure 20 and the patterned conductive layer 40. In some embodiments, the contact structure 60 electrically connects the patterned conductive layer 210 and the patterned conductive layer 40. In some embodiments, the contact structure 60 passes through or penetrates the dielectric layer 30. In some embodiments, the contact structure 60 is free from overlapping the air cavity 50 from a top view perspective.

In some embodiments, the contact structure 60 includes a seed layer 610 and a conductive layer 620. In some embodiments, the seed layer 610 is disposed or formed on the patterned conductive layer 210, and the conductive layer 620 is formed on the seed layer 610. In some embodiments, the seed layer 610 may be formed or include titanium, copper, or an alloy thereof, or any combination thereof. In some embodiments, the conductive layer 620 may be formed or include aluminum, copper, tungsten, cobalt, nickel, gold, or an alloy thereof. In some embodiments, the seed layer 410 of the patterned conductive layer 40 and the seed layer 610 of the contact structure 60 are formed of or include the same material. In some embodiments, the conductive layer 420 of the patterned conductive layer 40 and the conductive layer 620 of the contact structure 60 are formed of or include the same material.

The dielectric layer 80 may be disposed or formed on the patterned conductive layer 40. In some embodiments, the dielectric layer 80 is disposed or formed on the patterned conductive layer 40. In some embodiments, the dielectric layer 80 covers the patterned conductive layer 40. In some embodiments, the dielectric layer 80 directly contacts the patterned conductive layer 40. In some embodiments, the dielectric layer 80 has an opening 70A (also referred to as "a through via") exposing a portion of the patterned conductive layer 40. In some embodiments, the opening 70A is free from overlapping the air cavity 50 from a top view perspective. In some embodiments, the dielectric layer 80 may be formed of or include an insulating material such as silicon oxide, silicon nitride, silicon oxynitride, or a combination thereof.

Figure 2B:
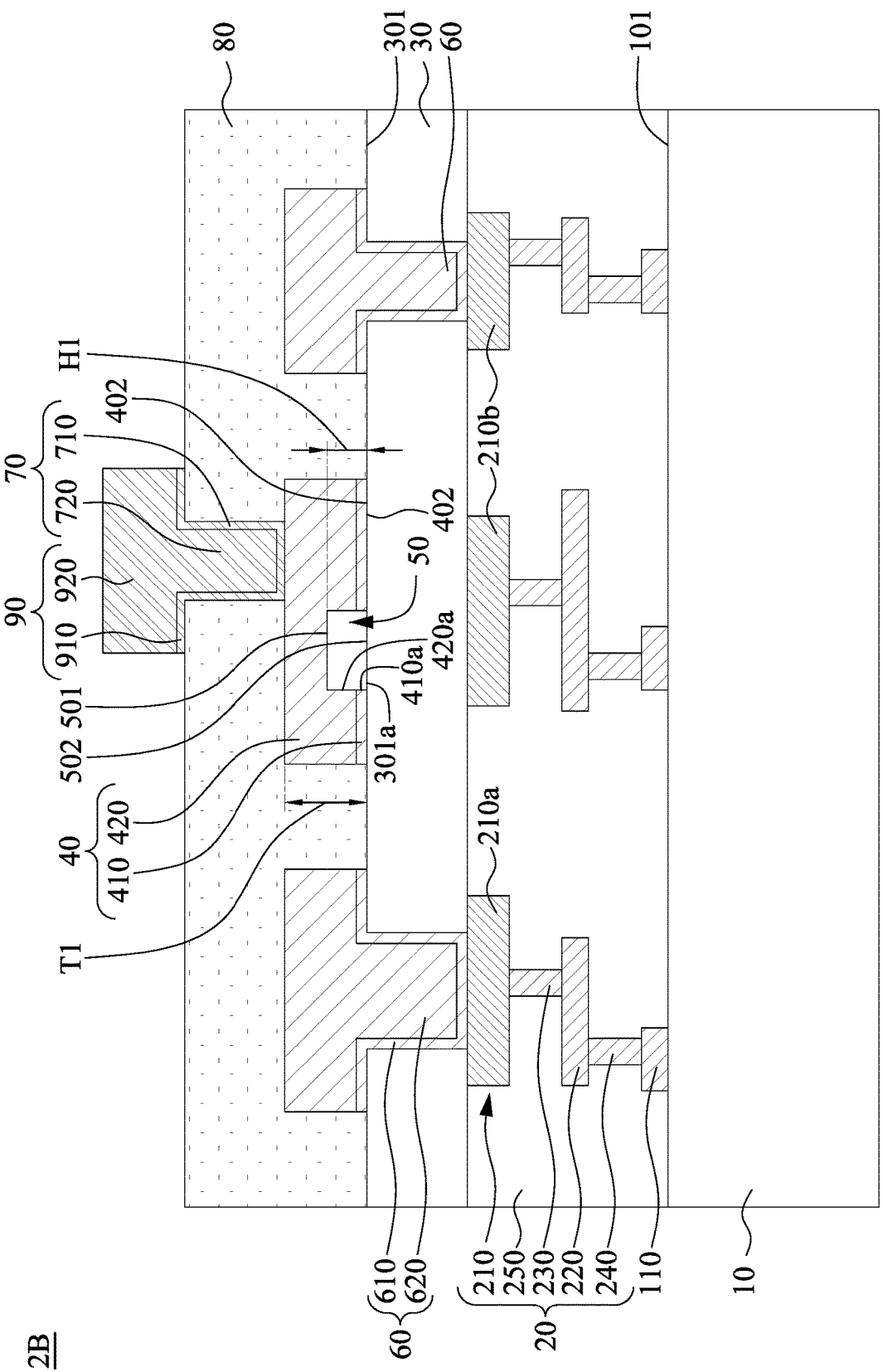
FIG. 2B is a cross-sectional view of a semiconductor device, in accordance with some embodiments of the present disclosure.

FIG. 2B is a cross-sectional view of a semiconductor device 2B, in accordance with some embodiments of the present disclosure. The semiconductor device 2A includes a substrate 10, an interconnection structure 20, dielectric layers 30 and 80, patterned conductive layers 40 and 90, an air cavity 50, and contact structures 60 and 70.

The substrate 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

In some embodiments, the substrate 10 includes one or more integrated circuits. The integrated circuit may include one or more MOS devices, one or more flash memory cells, or any combination thereof. In some embodiments, the substrate 10 has a surface 101 (also referred to as "an upper surface"). In some embodiments, the substrate 10 includes conductive pads 110 adjacent to the surface 110. The conductive pads 110 may be on the surface 110 of the substrate 10. In some embodiments, the conductive pads 110 serve to electrically connect the integrated circuits of the substrate 10 to the interconnection structure 20. The conductive pads 110 may be formed of, for example, copper, nickel, cobalt, aluminum, tungsten, or any combination thereof.

The interconnection structure 20 may be disposed or formed on the substrate 10. In some embodiments, the interconnection structure 20 includes a patterned conductive layer 210 (also referred to as "a top patterned conductive layer), a patterned conductive layer 220, conductive vias 230 and 240, and a dielectric layer 250. In some embodiments, the patterned conductive layers 210 and 220 and the conductive vias 230 and 240 are formed within or embedded in the dielectric layer 250.

In some embodiments, the patterned conductive layer 210 is the topmost patterned conductive layer of the interconnection structure 20. The patterned conductive layer 210 may serve to electrically connect to a redistribution layer (RDL) (e.g., the patterned conductive layer 40). In some embodiments, the patterned conductive layer 210 includes a connection portion 210a and a routing portion 210b. In some embodiments, the connection portion 210a directly connects or directly contacts the routing portion 210b. In some embodiments, the connection portion 210a of the patterned conductive layer 210 serves to electrically connect to an RDL (e.g., the patterned conductive layer 40).

In some embodiments, the patterned conductive layer 210 is electrically connected to the patterned conductive layer 220 through the conductive via 230. In some embodiments, the patterned conductive layer 220 is electrically connected to the conductive pad 110 through the conductive via 240. In some embodiments, the patterned conductive layers 210 and 220 and the conductive vias 230 and 240 may be formed or include aluminum, copper, tungsten, cobalt, or an alloy thereof. The number of the patterned conductive layers and the conductive vias of the interconnection structure 20 may vary according to actual applications and is not limited thereto.

The dielectric layer 30 may be disposed or formed on the interconnection structure 20. In some embodiments, the dielectric layer 30 is be disposed or formed on the patterned conductive layer 210. In some embodiments, the dielectric layer 30 directly contacts the patterned conductive layer 210. In some embodiments, the dielectric layer 30 may be formed of or include an insulating material such as silicon oxide, silicon nitride, silicon oxynitride, or a combination thereof.

The patterned conductive layer 40 may be disposed or formed on the dielectric layer 30. In some embodiments, the patterned conductive layer 40 is disposed or formed on a surface 301 (also referred to as "an upper surface") of the dielectric layer 30. In some embodiments, the patterned conductive layer 40 may be an RDL. In some embodiments, a thickness T1 of the patterned conductive layer 40 may be equal to or greater than about 0.8 μm. In some embodiments, the thickness T1 of the patterned conductive layer 40 may be from about 0.8 μm to about 1 μm.

In some embodiments, the patterned conductive layer 40 includes a seed layer 410 and a conductive layer 420. In some embodiments, the seed layer 410 is disposed or formed on the surface 301 of the dielectric layer 30, and the conductive layer 420 is formed on the seed layer 410. In some embodiments, the seed layer 410 may be formed or include titanium, copper, or an alloy thereof, or any combination thereof. In some embodiments, the conductive layer 420 may be formed or include aluminum, copper, tungsten, cobalt, nickel, gold, or an alloy thereof.

The air cavity 50 (also referred to as "an air gap") may be formed or located between the interconnection structure 20 and the patterned conductive layer 40. In some embodiments, the air cavity 50 is between the patterned conductive layer 210 and the patterned conductive layer 40. In some embodiments, the air cavity 50 is between the patterned conductive layer 40 and the dielectric layer 30.

In some embodiments, the air cavity 50 is within the patterned conductive layer 40. In some embodiments, a portion (e.g., surface 301) of the dielectric layer 30 is exposed to the air cavity 50. In some embodiments, a portion 301a of the surface 301 of the dielectric layer 30 is exposed to the air cavity 50. In some embodiments, the air cavity 50 is defined by the patterned conductive layer 40 and the surface 301 of the dielectric layer 30. In some embodiments, the air cavity 50 is defined by the patterned conductive layer 40 and a portion 301a of the surface 301 of the dielectric layer 30. In some embodiments, a surface 502 (also referred to as "a bottom surface) of the air gap 50 and a surface 402 (also referred to as "a bottom surface) of the patterned conductive layer 40 are at substantially the same elevation.

In some embodiments, a portion of the seed layer 410 is exposed to the air cavity 50. In some embodiments, a surface 410a of the seed layer 410 is exposed to the air cavity 50. In some embodiments, a portion of the conductive layer 420 is exposed to the air cavity 50. In some embodiments, a surface 420a of the conductive layer 420 is exposed to the air cavity 50. In some embodiments, the air cavity 50 is defined by the seed layer 410, the conductive layer 420, and the surface 301 of the dielectric layer 30. In some embodiments, the air cavity 50 is defined by the surface 410a of the seed layer 410, the surface 420a of the conductive layer 420, and a portion 301a of the surface 301 of the dielectric layer 30.

In some embodiments, a height H1 of the air cavity 50 is equal to or greater than about 2000 Å. In some embodiments, the height H1 of the air cavity 50 is from about 2000 Å to about 2500 Å. In some embodiments, a ratio of the height H1 of the air cavity 50 to the thickness T1 of the patterned conductive layer 40 (i.e., the sum of the thickness of the seed layer 410 and the thickness of the conductive layer 420) is equal to or greater than about 0.25. In some embodiments, the ratio of the height H1 of the air cavity 50 to the thickness T1 of the patterned conductive layer 40 is from about 0.25 to about 0.5.

The contact structure 60 may electrical connect the interconnection structure 20 and the patterned conductive layer 40. In some embodiments, the contact structure 60 electrically connects the patterned conductive layer 210 and the patterned conductive layer 40. In some embodiments, the contact structure 60 passes through or penetrates the dielectric layer 30. In some embodiments, the contact structure 60 is free from overlapping the air cavity 50 from a top view perspective.

In some embodiments, the contact structure 60 includes a seed layer 610 and a conductive layer 620. In some embodiments, the seed layer 610 is disposed or formed on the patterned conductive layer 210, and the conductive layer 620 is formed on the seed layer 610. In some embodiments, the seed layer 610 may be formed or include titanium, copper, or an alloy thereof, or any combination thereof. In some embodiments, the conductive layer 620 may be formed or include aluminum, copper, tungsten, cobalt, nickel, gold, or an alloy thereof. In some embodiments, the seed layer 410 of the patterned conductive layer 40 and the seed layer 610 of the contact structure 60 are formed of or include the same material. In some embodiments, the conductive layer 420 of the patterned conductive layer 40 and the conductive layer 620 of the contact structure 60 are formed of or include the same material.

The contact structure 70 may be disposed or formed on the patterned conductive layer 40. In some embodiments, the contact structure 70 is free from overlapping the air cavity 50 from a top view perspective. In some embodiments, the contact structure 70 electrically connects to the patterned conductive layer 40.

The dielectric layer 80 may be disposed or formed on the patterned conductive layer 40. In some embodiments, the dielectric layer 80 is disposed or formed on the patterned conductive layer 40. In some embodiments, the dielectric layer 80 covers the patterned conductive layer 40. In some embodiments, the dielectric layer 80 directly contacts the patterned conductive layer 40. In some embodiments, the contact structure 70 passes through or penetrates the dielectric layer 80. In some embodiments, the dielectric layer 80 may be formed of or include an insulating material such as silicon oxide, silicon nitride, silicon oxynitride, or a combination thereof.

The patterned conductive layer 90 may be disposed or formed on the dielectric layer 80. In some embodiments, the patterned conductive layer 90 electrical connects to the patterned conductive layer 40 through the contact structure 70. In some embodiments, the patterned conductive layer 90 may be an RDL.

In some embodiments, the patterned conductive layer 90 includes a seed layer 910 and a conductive layer 920. In some embodiments, the seed layer 910 is disposed or formed on the dielectric layer 80, and the conductive layer 920 is formed on the seed layer 910. In some embodiments, the seed layer 910 may be formed or include titanium, copper, or an alloy thereof, or any combination thereof. In some embodiments, the conductive layer 920 may be formed or include aluminum, copper, tungsten, cobalt, nickel, gold, or an alloy thereof. In some embodiments, the seed layer 910 of the patterned conductive layer 90 and the seed layer 710 of the contact structure 70 are formed of or include the same material. In some embodiments, the conductive layer 920 of the patterned conductive layer 90 and the conductive layer 720 of the contact structure 70 are formed of or include the same material.

Figure 3:
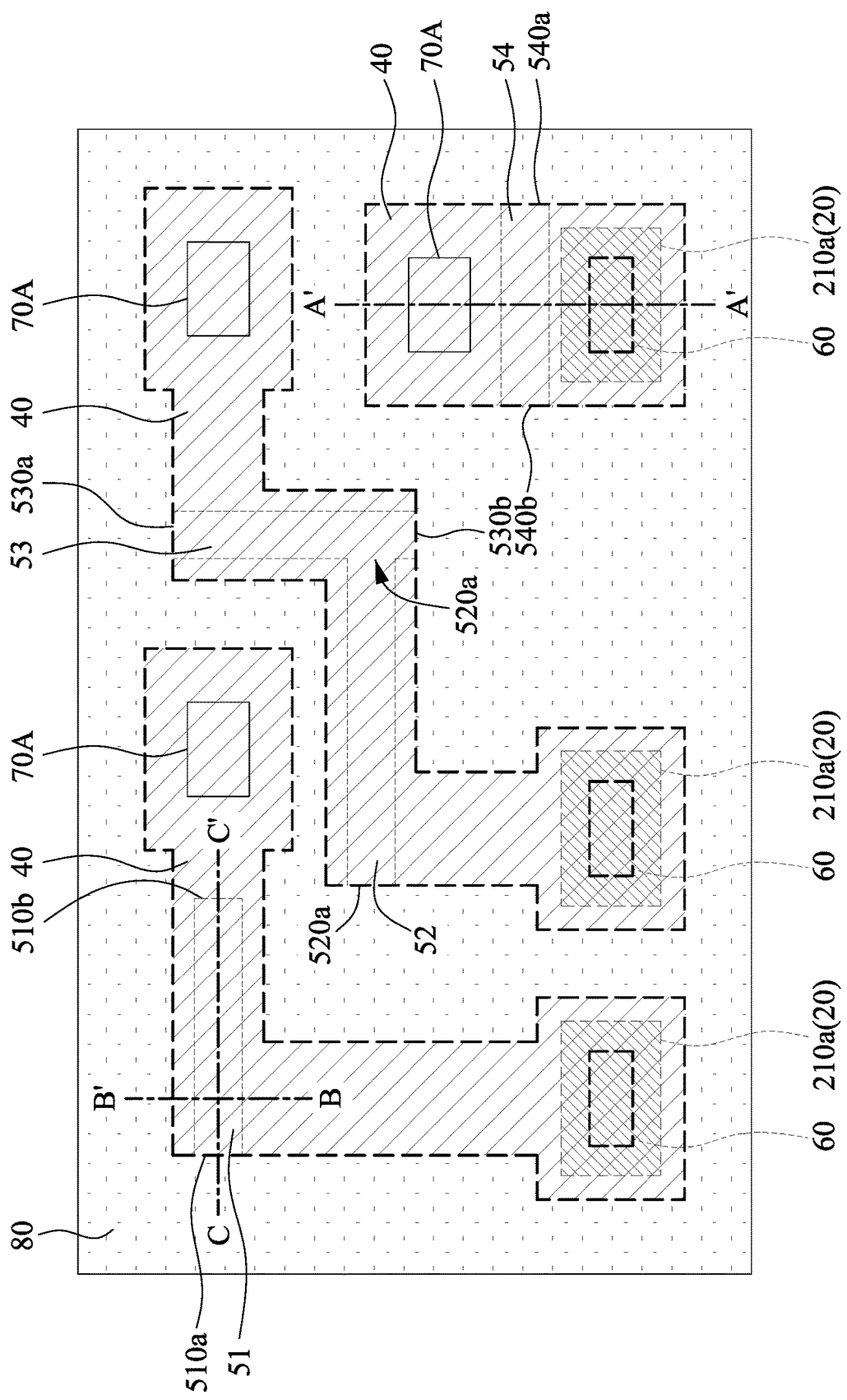
FIG. 3 is a top view of a semiconductor device, in accordance with some embodiments of the present disclosure.

FIG. 3 is a top view of a semiconductor device 3, in accordance with some embodiments of the present disclosure. The semiconductor device 3 includes a substrate (not shown in FIG. 3), an interconnection structure 20, a patterned conductive layer 40, an air cavity 50, a contact structure 60, and a dielectric layer 80. It should be noted that some components or structures are omitted for clarity. For example, the routing portion 210b of the patterned conductive layer 210 of the interconnection structure 20 is omitted in FIG. 3 for clarity.

In some embodiments, the connection portion 210a of the patterned conductive layer 210 of the interconnection structure 20 is free from overlapping the air cavity 50 from a top view perspective. In some embodiments, the contact structure 60 is free from overlapping the air cavity 50 from a top view perspective. In some embodiments, the opening 70A of the dielectric layer 80 is free from overlapping the air cavity 50 from a top view perspective.

In some embodiments, the air cavity 50 includes one or more air channels (e.g., air channels 51, 52, 53, and 54). In some embodiments, the air channels 51, 52, 53, and 54 extend within the patterned conductive layer 40.

In some embodiments, the air channel 51 extends within the patterned conductive layer 40. In some embodiments, the air channel 51 has an end 510a stopped at the dielectric layer 80. In some embodiments, the end 510a of the air channel 51 is defined by a portion of the dielectric layer 80. In some embodiments, the air channel 51 further has an end 510b opposite to the end 510a and stopped at the patterned conductive layer 40. In some embodiments, the end 510b of the air channel 51 is defined by a portion of the patterned conductive layer 40.

In some embodiments, the air channel 52 extends within the patterned conductive layer 40. In some embodiments, the air channel 52 has an end 520a stopped at the dielectric layer 80. In some embodiments, the end 520a of the air channel 52 is defined by a portion of the dielectric layer 80. In some embodiments, the air channel 52 further has an end 520b opposite to the end 520a and connected to the air channel 53.

In some embodiments, the air channel 53 is connected to the air channel 52. In some embodiments, the air channel 53 extends within the patterned conductive layer 40. In some embodiments, the air channel 53 has an end 530a stopped at the dielectric layer 80. In some embodiments, the end 530a of the air channel 53 is defined by a portion of the dielectric layer 80. In some embodiments, the air channel 53 further has an end 530b opposite to the end 530a and stopped at the dielectric layer 80. In some embodiments, the end 530b of the air channel 53 is defined by a portion of the dielectric layer 80. In some embodiments, the air channel 52 is angled with the air channel 53.

In some embodiments, the air channel 54 extends within the patterned conductive layer 40. In some embodiments, the air channel 54 has an end 540a stopped at the dielectric layer 80. In some embodiments, the end 540a of the air channel 54 is defined by a portion of the dielectric layer 80. In some embodiments, the air channel 54 further has an end 540b opposite to the end 540a and stopped at the dielectric layer 80. In some embodiments, the end 540b of the air channel 54 is defined by a portion of the dielectric layer 80.

In some embodiments, a width of the air channel (e.g., the air channels 51, 52, 53, and 54) in a direction along the cross-sectional line B-B' is equal to or greater than about 3 μm. In some embodiments, a width of each of the portions (also referred to as "supporting legs") of the patterned conductive layer 40 on opposite sides of the air channel in a direction along the cross-sectional line B-B' is equal to or greater than about 1 μm. A sum of the widths of the two supporting legs and the width of the air channel in a direction along the cross-sectional line B-B' may be a width of the patterned conductive layer 40 in a direction along the cross-sectional line B-B'. In some embodiments, a ratio of a width of the air channel to a width of the patterned conductive layer 40 in a direction along the cross-sectional line B-B' is equal to or less than about 0.6. According to some embodiments of the present disclosure, with the aforesaid design, the supporting legs of the patterned conductive layer 40 can provide sufficient structural support, and thus the patterned conductive layer 40 having the air cavity 50 formed there-within can be provided with sufficient stability without collapse.

Figure 4A:
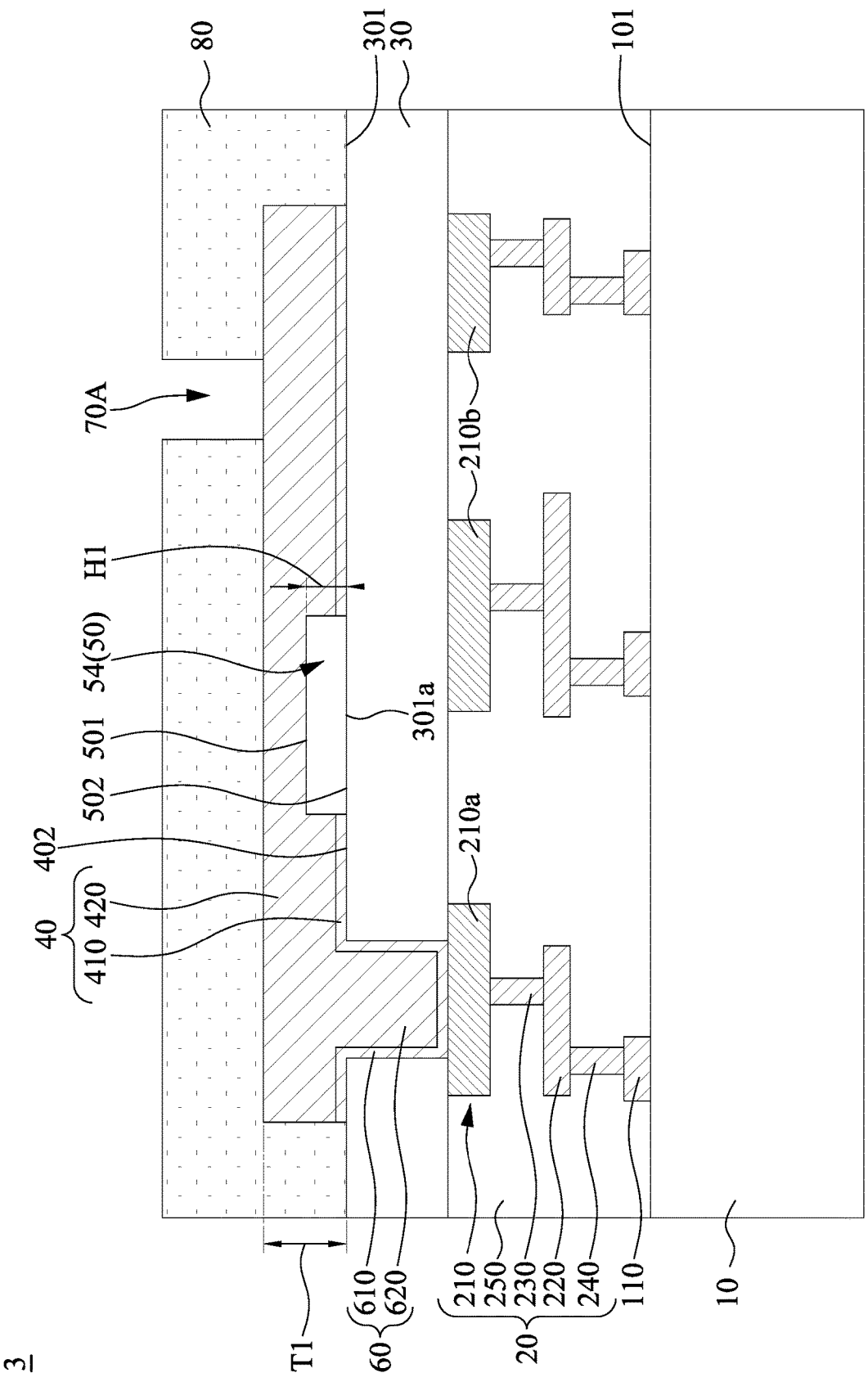
FIG. 4A is a cross-sectional view of a semiconductor device, in accordance with some embodiments of the present disclosure.

FIG. 4A is a cross-sectional view of a semiconductor device, in accordance with some embodiments of the present disclosure. In some embodiments, FIG. 4A is a cross-sectional view along the cross-sectional line A-A' in FIG. 3.

In some embodiments, the contact structure 60 is free from overlapping the air channel 54 from a top view perspective. In some embodiments, the opening 70A is free from overlapping the air channel 54 from a top view perspective.

Figure 4B:
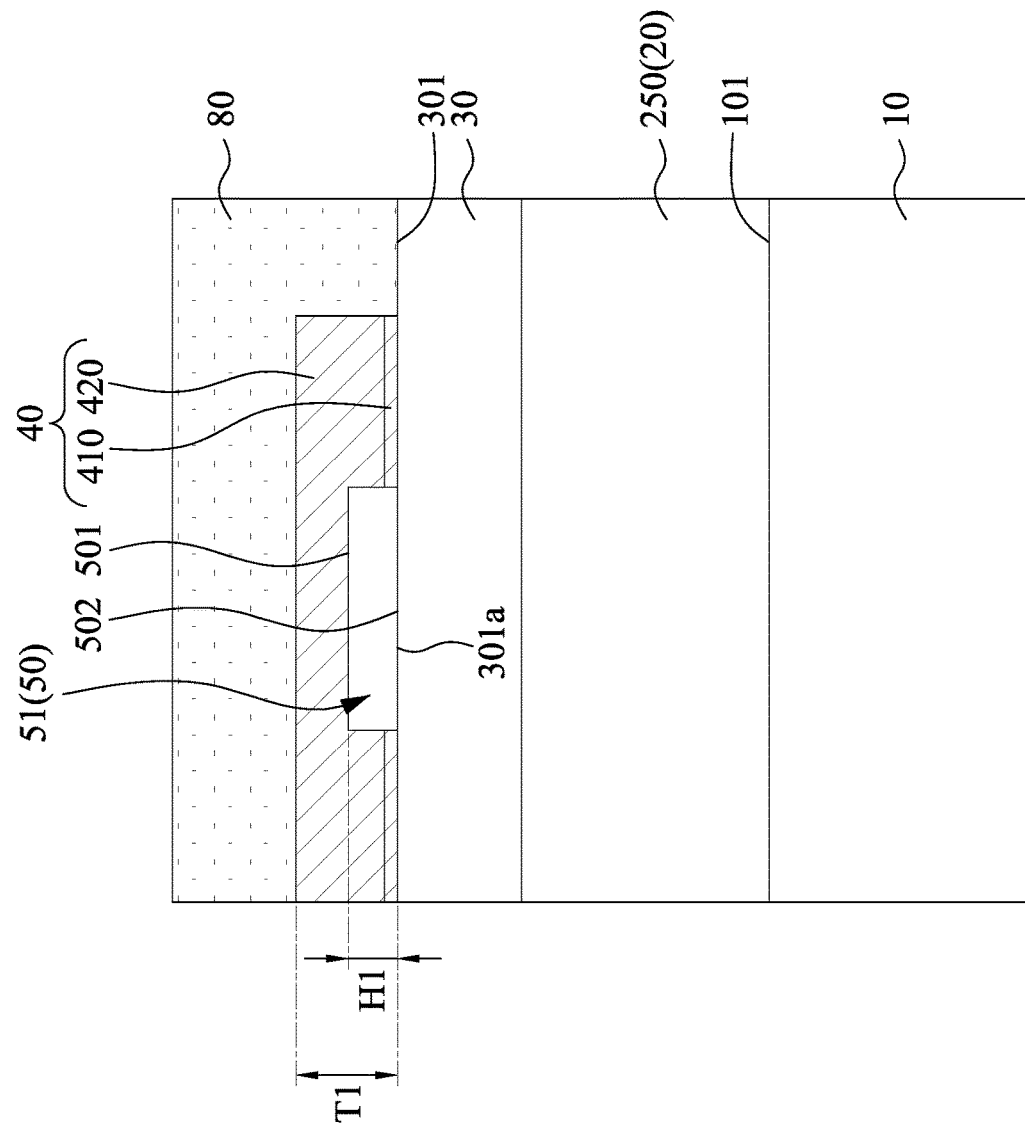
FIG. 4B is a cross-sectional view of a semiconductor device, in accordance with some embodiments of the present disclosure.

FIG. 4B is a cross-sectional view of a semiconductor device, in accordance with some embodiments of the present disclosure. In some embodiments, FIG. 4B is a cross-sectional view along the cross-sectional line B-B' in FIG. 3.

In some embodiments, the surface 501 (or the top surface) of the air channel 51 is defined by the patterned conductive layer 40. In some embodiments, the surface 502 (or the bottom surface) of the air channel 51 is or is defined by the portion 301a of the surface 301 of the dielectric layer 30.

Figure 4C:
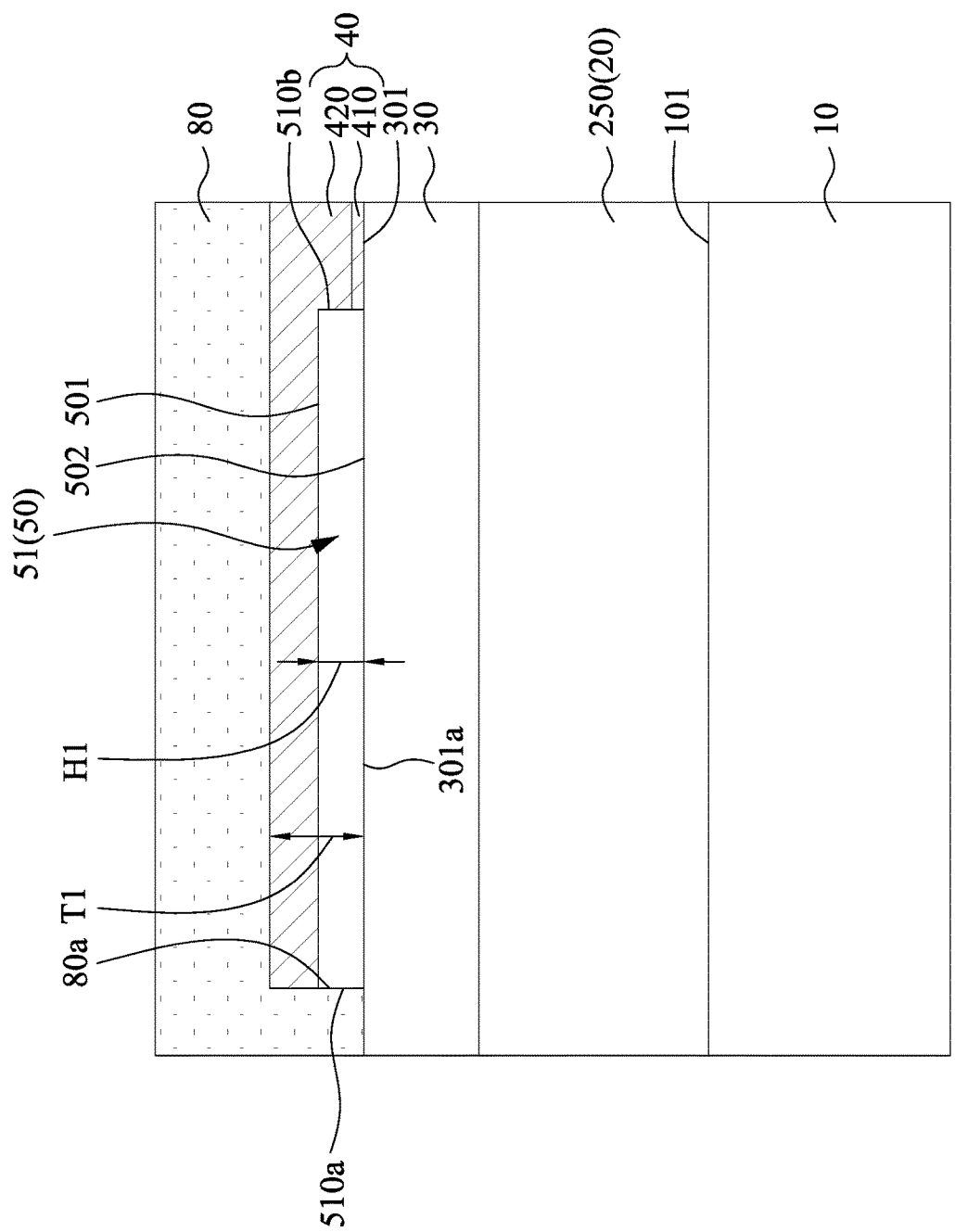
FIG. 4C is a cross-sectional view of a semiconductor device, in accordance with some embodiments of the present disclosure.

FIG. 4C is a cross-sectional view of a semiconductor device, in accordance with some embodiments of the present disclosure. In some embodiments, FIG. 4C is a cross-sectional view along the cross-sectional line C-C' in FIG. 3.

In some embodiments, a portion of the dielectric layer 80 is exposed to the air cavity 50. In some embodiments, a portion of the dielectric layer 80 is exposed to the air channel 51.

In some embodiments, the end 510a of the air channel 51 is defined by a portion of the dielectric layer 80. In some embodiments, the end 510a of the air channel 51 is defined by a portion 80a of a surface of the dielectric layer 80. In some embodiments, the end 510b of the air channel 51 is defined by the seed layer 410 and the conductive layer 420 of the patterned conductive layer 40.

FIG. 5A, FIG. 5B, FIG. 5C, FIG. 5D, FIG. 5E, FIG. 5F, and

Figure 5A:
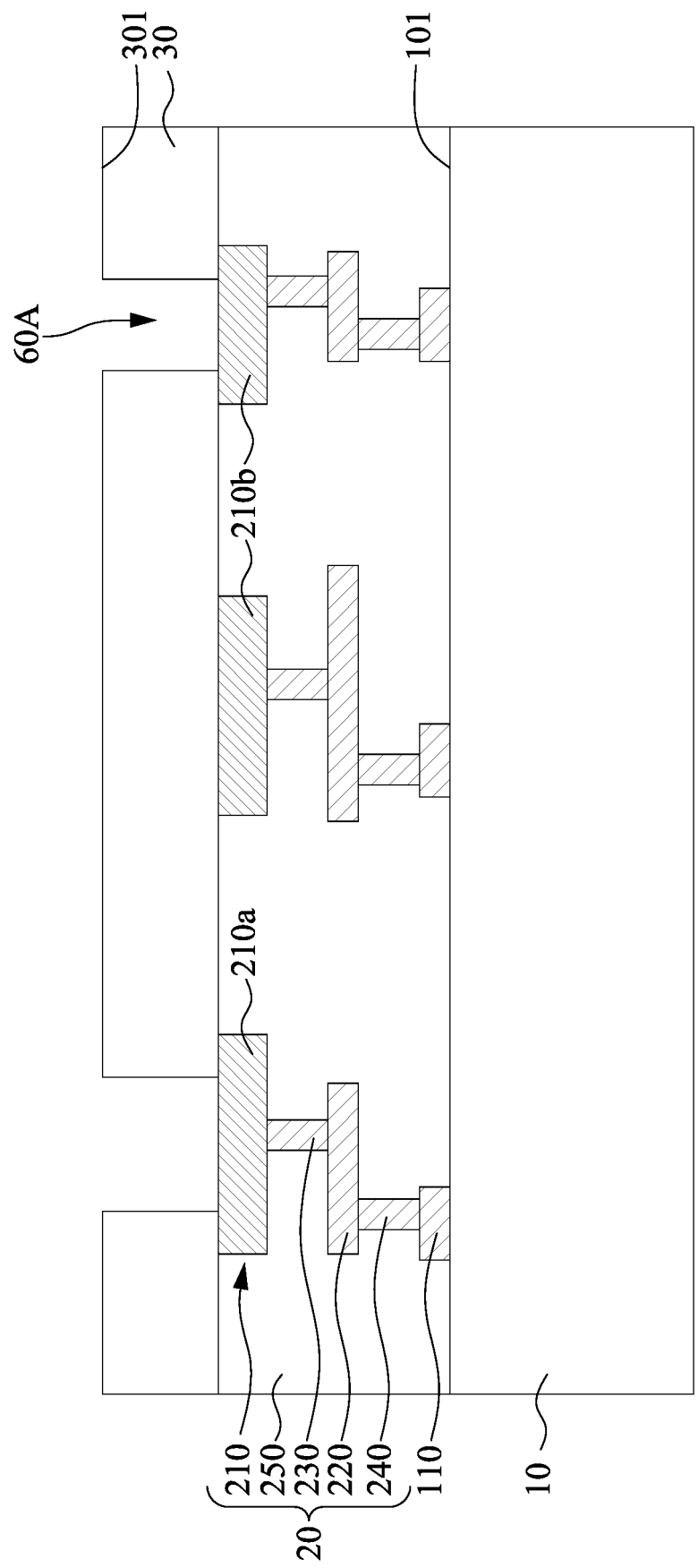
FIG. 5A illustrates one stage of a method of manufacturing a semiconductor device, in accordance with some embodiments of the present disclosure.
Figure 5B:
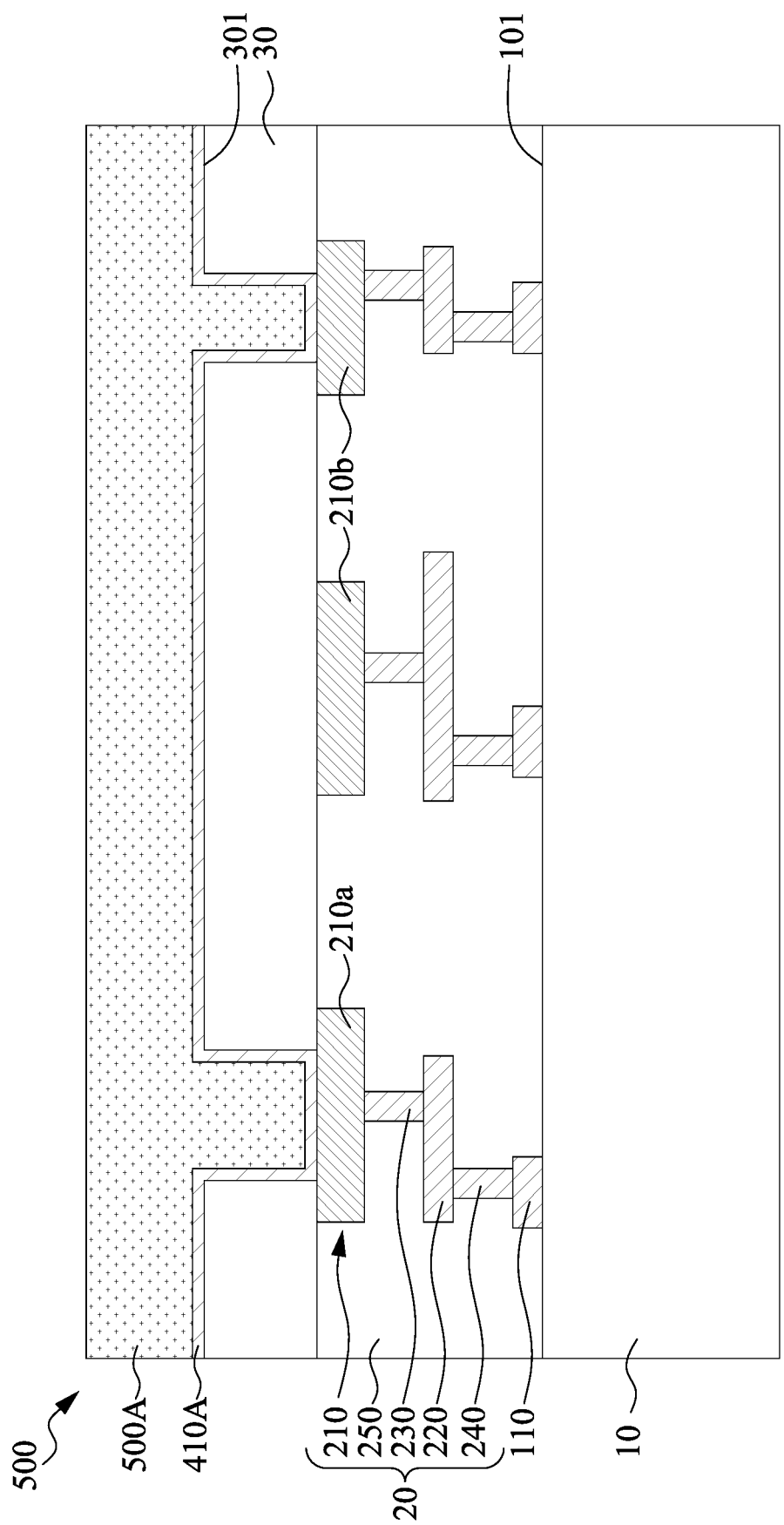
FIG. 5B illustrates one stage of a method of manufacturing a semiconductor device, in accordance with some embodiments of the present disclosure.
Figure 5C:
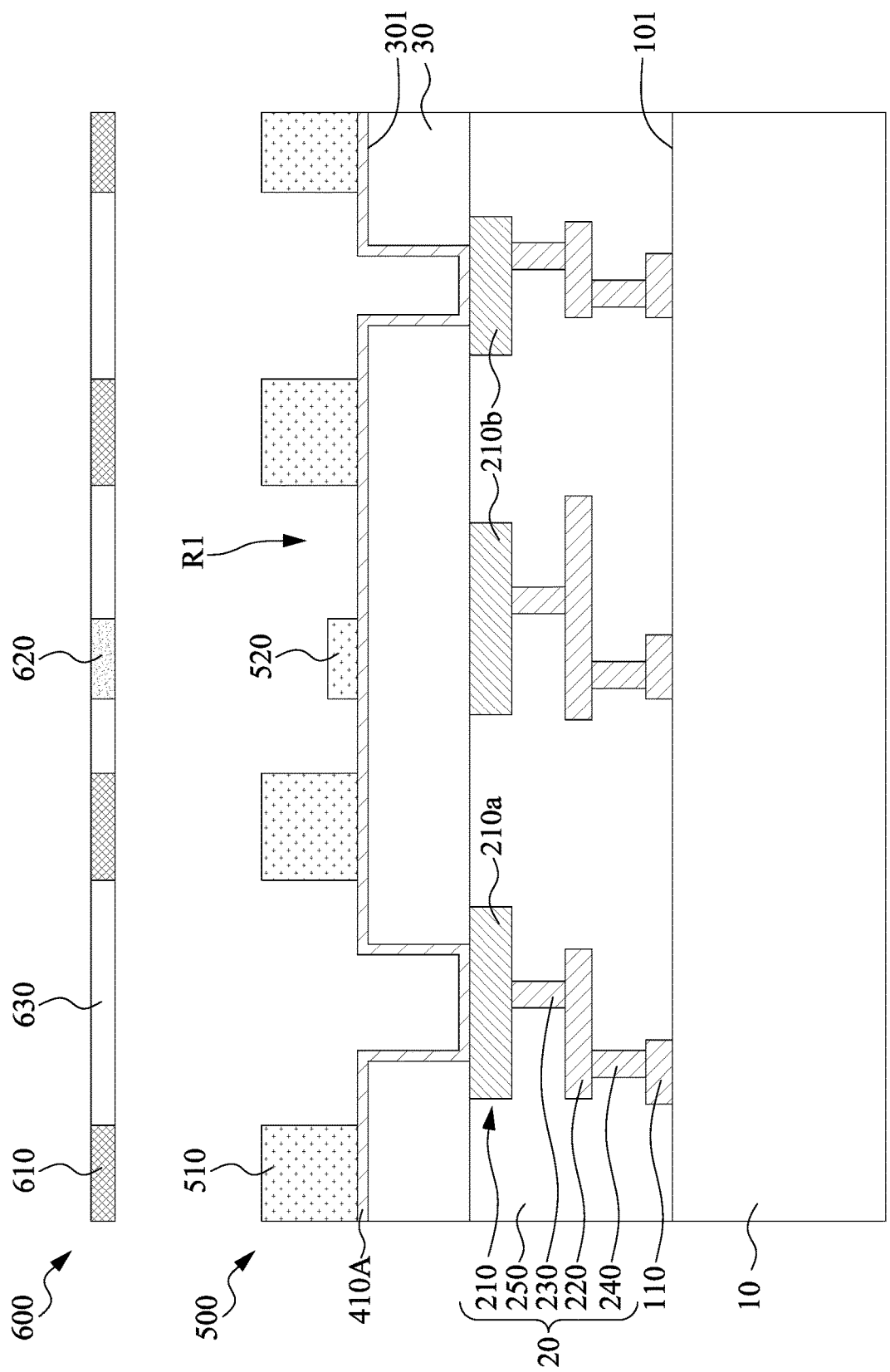
FIG. 5C illustrates one stage of a method of manufacturing a semiconductor device, in accordance with some embodiments of the present disclosure.
Figure 5D:
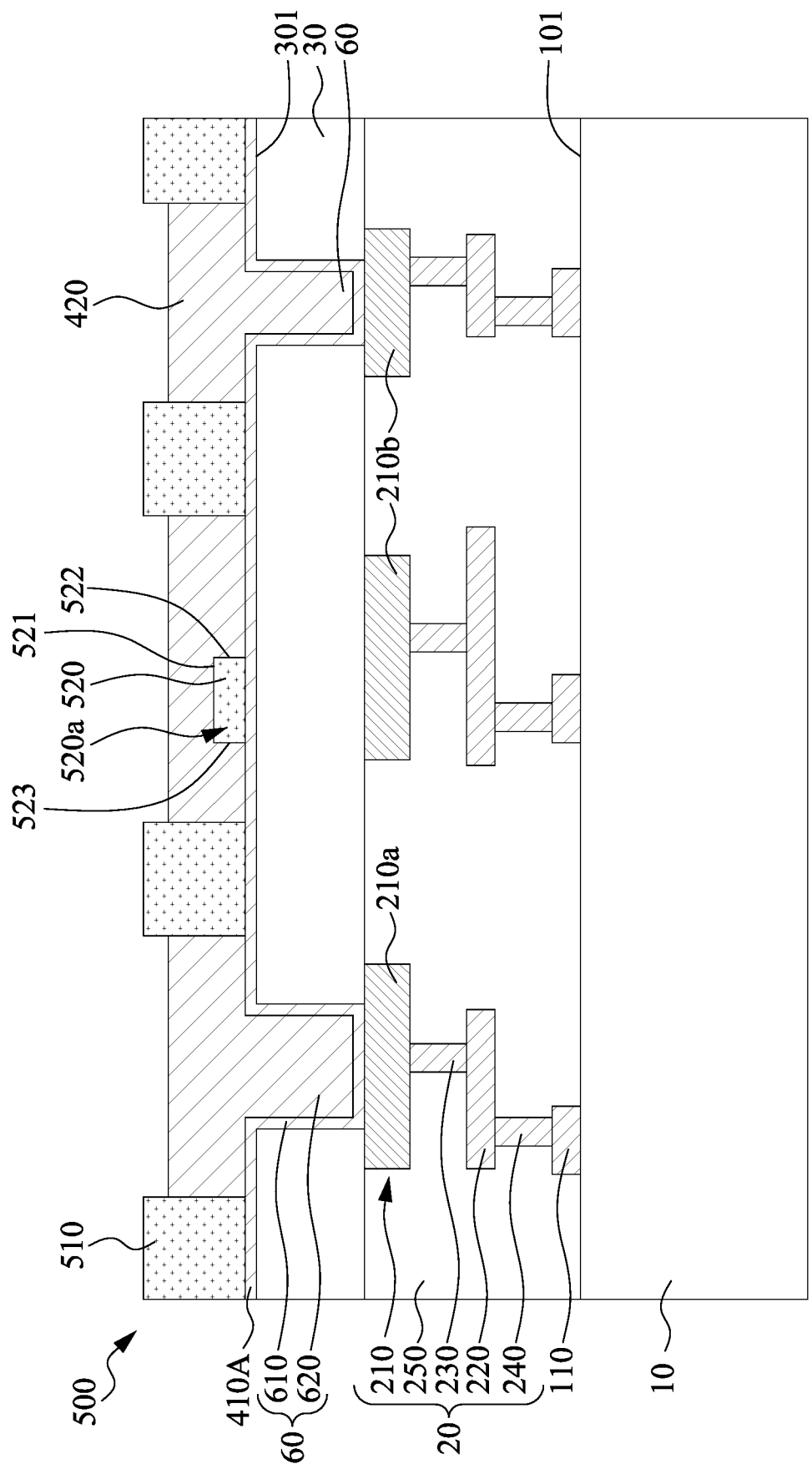
FIG. 5D illustrates one stage of a method of manufacturing a semiconductor device, in accordance with some embodiments of the present disclosure.
Figure 5E:
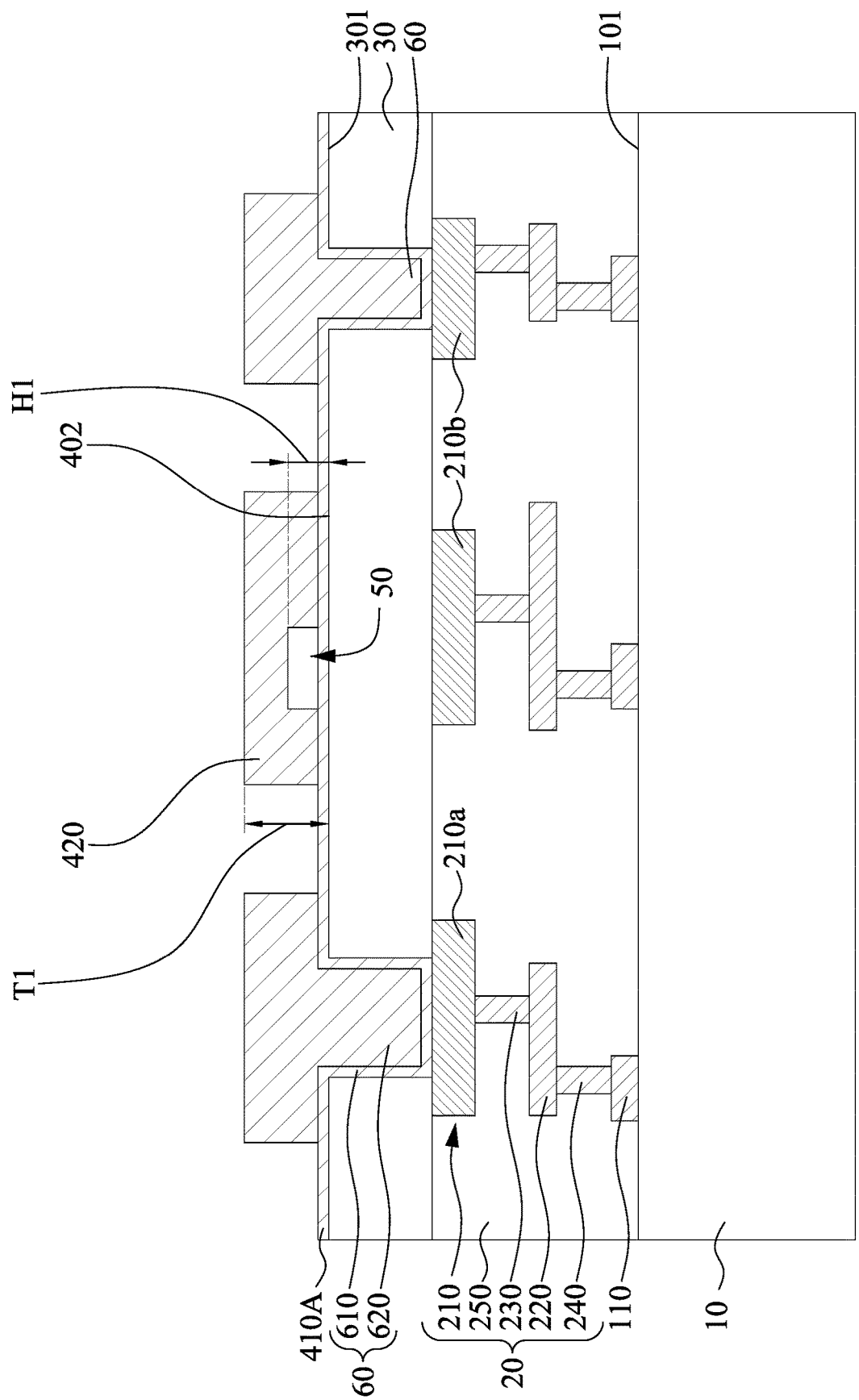
FIG. 5E illustrates one stage of a method of manufacturing a semiconductor device, in accordance with some embodiments of the present disclosure.
Figure 5F:
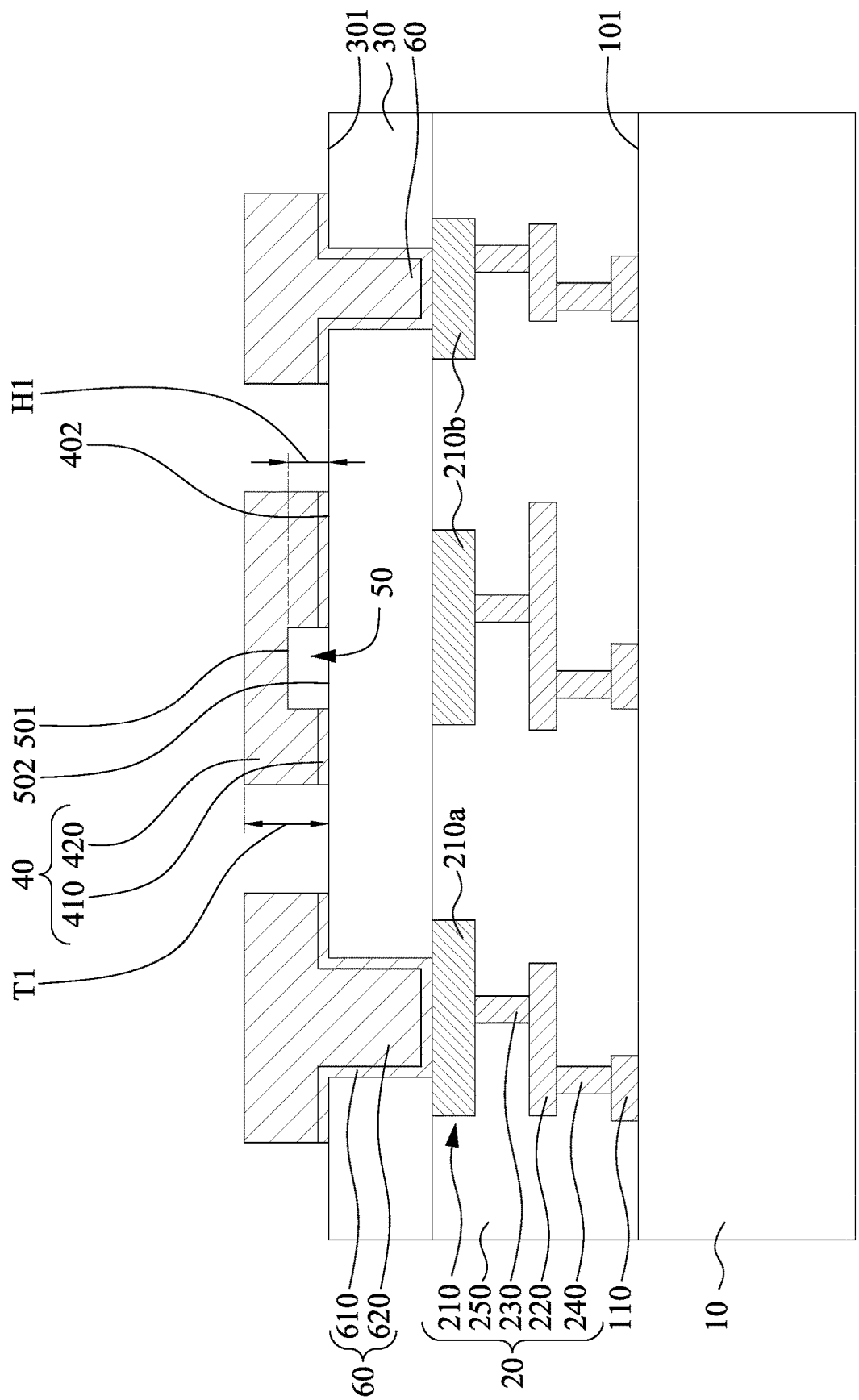
FIG. 5F illustrates one stage of a method of manufacturing a semiconductor device, in accordance with some embodiments of the present disclosure.
Figure 5G:
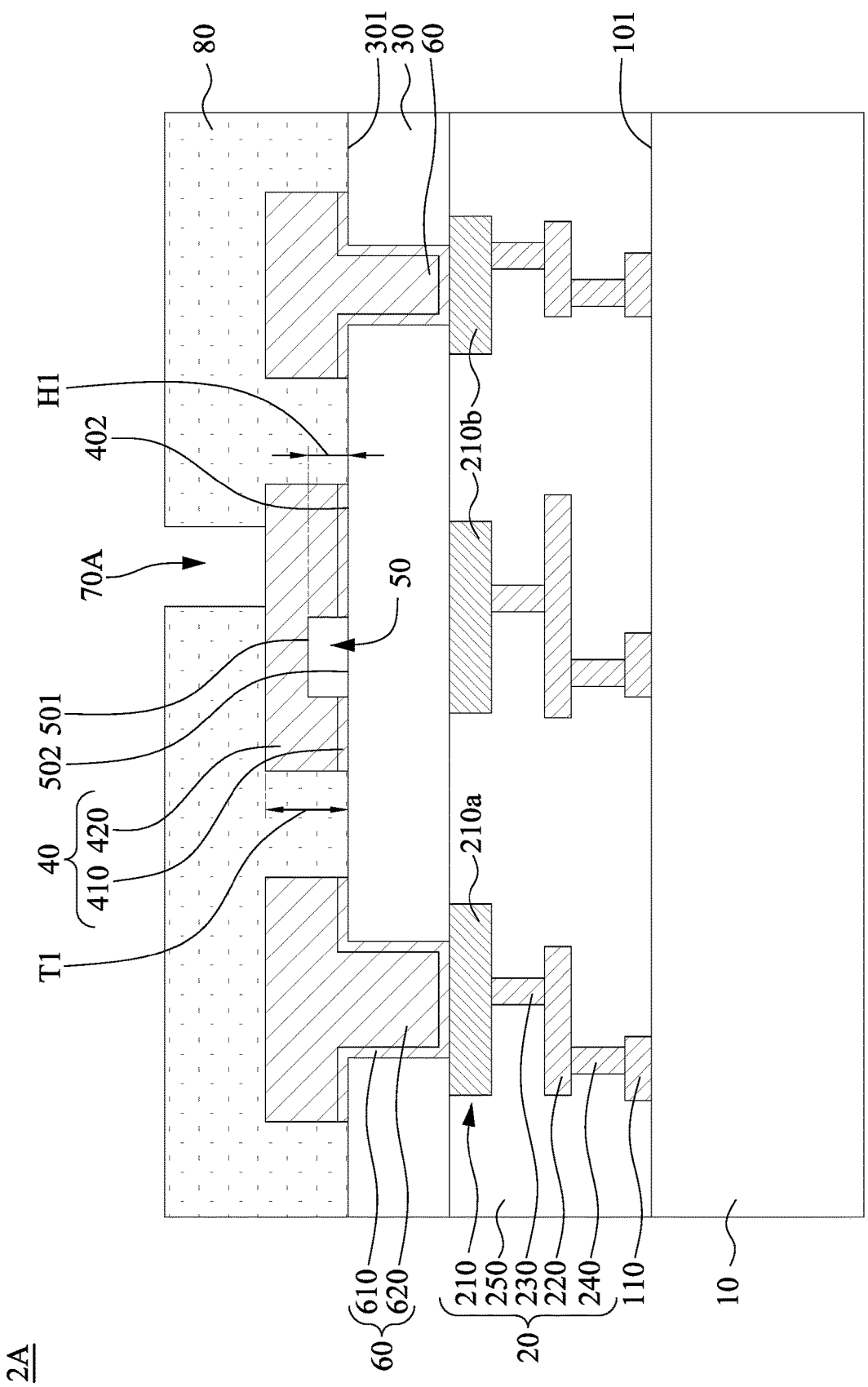
FIG. 5G illustrates one stage of a method of manufacturing a semiconductor device, in accordance with some embodiments of the present disclosure.

FIG. 5G illustrate various stages of a method of manufacturing a semiconductor device 2A, in accordance with some embodiments of the present disclosure.

Referring to FIG. 5A, an interconnection structure 20 may be provided, and a dielectric layer 30 may be formed on the interconnection structure 20. In some embodiments, the interconnection structure 20 is formed on a substrate 10. In some embodiments, the dielectric layer 30 has one or more openings 60A (also referred to as "through vias") exposing a portion of the patterned conductive layer 210. In some embodiments, a dielectric material may be formed on the interconnection structure 20, and a photolithography operation may be performed to form the openings 60A penetrating the dielectric material so as to form the dielectric layer 30.

Referring to FIG. 5B, a sacrificial material 500A may be formed on the dielectric layer 30. In some embodiments, a seed layer material 410A is formed on the dielectric layer 30 and in the openings 60A, and the sacrificial material 500A is formed on the seed layer material 410A. In some embodiments, the seed layer material 410A may be formed by plating. In some embodiments, the seed layer material 410A is or includes titanium and copper. In some embodiments, the sacrificial material 500A is or includes a photoresist material. In some embodiments, the sacrificial material 500A is a positive photoresist.

Referring to FIG. 5C, a pattern 520 (also referred to as "a sacrificial pattern") may be formed on the dielectric layer 30. In some embodiments, a sacrificial layer 500 including patterns 510 and 520 is formed on the dielectric layer 30. In some embodiments, the pattern 510 has a thickness 510T, the pattern 520 (or the sacrificial pattern) has a thickness 520T, and the thickness 520T is smaller than the thickness 510T.

In some embodiments, the pattern 510 of the sacrificial layer 500 defines a predetermined region R1 on the dielectric layer 30, and predetermined region R1 is predetermined for a patterned conductive layer 40 to be formed therein in subsequent operations. In some embodiments, the pattern 520 entirely overlaps the predetermined region R1 defined by the pattern 510. In some embodiments, the pattern 520 is within the predetermined region R1 defined by the pattern 510.

In some embodiments, the sacrificial layer 500 may be formed by the following operations. In some embodiments, a photomask 600 is provided over the sacrificial material 500A, and the photomask 600 has a blocking region 610, an opaque region 620, and a clear region 630. In some embodiments, the blocking region 610 is configured to block exposing radiation from passing through, the opaque region 620 is configured to allow exposing radiation to partially pass through, and the clear region 630 is configured to allow exposing radiation to pass through. In some embodiments, the blocking region 610 is formed of or includes a light-blocking material or a light-absorbing material. In some embodiments, the opaque region 620 is formed of or includes a material that is substantially opaque to the radiation of a predetermined wavelength to be used for exposure. In some embodiments, the material of the opaque region 620 includes, for example, chromium or chromium oxide. In some embodiments, the clear region 630 is formed of or includes a material that is substantially transparent to the radiation of a predetermined wavelength to be used for exposure.

In some embodiments, a photolithography operation is performed on the sacrificial material 500A according to the photomask 600 to form the sacrificial layer 500 including the patterns 510 and 520. In some embodiments, the pattern 510 is formed directly under the blocking region 610 of the photomask 600 by performing the photolithography operation. In some embodiments, a portion of the sacrificial material 500A directly under the opaque region 620 of the photomask 600 is partially removed by performing the photolithography operation, so as to form the pattern 520 directly under the opaque region 620 of the photomask 600. In some embodiments, a portion of the sacrificial material 500A directly under the clear region 630 of the photomask 600 is completely removed by performing the photolithography operation. In some embodiments, a portion of the seed layer material 410A is exposed by the sacrificial layer 500 and directly under the clear region 630 of the photomask 600. In some embodiments, a portion of the seed layer material 410A in the predetermined region R1 is exposed by the sacrificial layer 500. In some embodiments, the pattern 510 directly connects to the pattern 520.

Referring to FIG. 5D, a patterned conductive layer may be formed on the dielectric layer 30 and the pattern 520 of the sacrificial layer 500. In some embodiments, a conductive layer 420 is formed on the seed layer material 410A. In some embodiments, the conductive layer 420 is formed within the predetermined region R1. The patterned conductive layer may include the conductive layer 420 and the seed layer material 410A. In some embodiments, the conductive layer 420 is formed by plating. In some embodiments, the conductive layer 420 is not formed on the pattern 510 of the sacrificial layer 500.

In some embodiments, after the conductive layer 420 (or the patterned conductive layer) is formed on the pattern 520, a portion 520a of the pattern 520 is exposed from the conductive layer 420 (or the patterned conductive layer). In some embodiments, the portion 520a is a side surface of the pattern 520 that is substantially perpendicular to a top surface 521 and side surfaces 522 and 523 of the pattern 520.

Referring to FIG. 5E, the pattern 520 of the sacrificial layer 500 may be removed to form an air cavity 50 within the conductive layer 420. In some embodiments, the pattern 520 of the sacrificial layer 500 is removed to form an air cavity 50 within the patterned conductive layer (e.g., including the conductive layer 420 and the seed layer material 410A). In some embodiments, the pattern 510 of the sacrificial layer 500 is also removed. In some embodiments, the pattern 510 and the pattern 520 of the sacrificial layer 500 are removed in the same operation. In some embodiments, the conductive layer 420 is exposed to the air cavity 50. In some embodiments, the pattern 510 and the pattern 520 of the sacrificial layer 500 are removed by a photoresist stripping operation. In some embodiments, the pattern 510 and the pattern 520 of the sacrificial layer 500 are removed by a removal solution.

Referring to FIG. 5F, a portion of the seed layer material 410A exposed from the conductive layer 420 may be removed, so as to form a patterned conductive layer 40 including the seed layer 410 and the conductive layer 420. In some embodiments, the patterned conductive layer 40 is formed within the predetermined region R1.

Referring to FIG. 5G, a dielectric layer 80 may be formed on the patterned conductive layer 40. In some embodiments, the dielectric layer 80 has one or more openings 70A (also referred to as "through vias") exposing a portion of the patterned conductive layer 40. In some embodiments, a dielectric material may be formed on the patterned conductive layer 40, and a photolithography operation may be performed to form the openings 70A penetrating the dielectric material so as to form the dielectric layer 80. As such, the semiconductor device 2A is formed.

According to some embodiments of the present disclosure, by using the photomask 600 to form the sacrificial layer 500 to form the patterned conductive layer 40 and the air cavity 50 within the patterned conductive layer 40, the parasitic capacitance of the as-formed semiconductor device 2A can be reduced without performing additional operations or modifying existing operations, such as without modifying the arrangement of the patterned conductive layer 210, the arrangement of the patterned conductive layer 40, the arrangement of the contact structure 60, and etc. Therefore, the parasitic capacitance of the as-formed semiconductor device 2A can be reduced by a relatively simplified manufacturing process, and the cost is reduced as well.

Figure 6A:
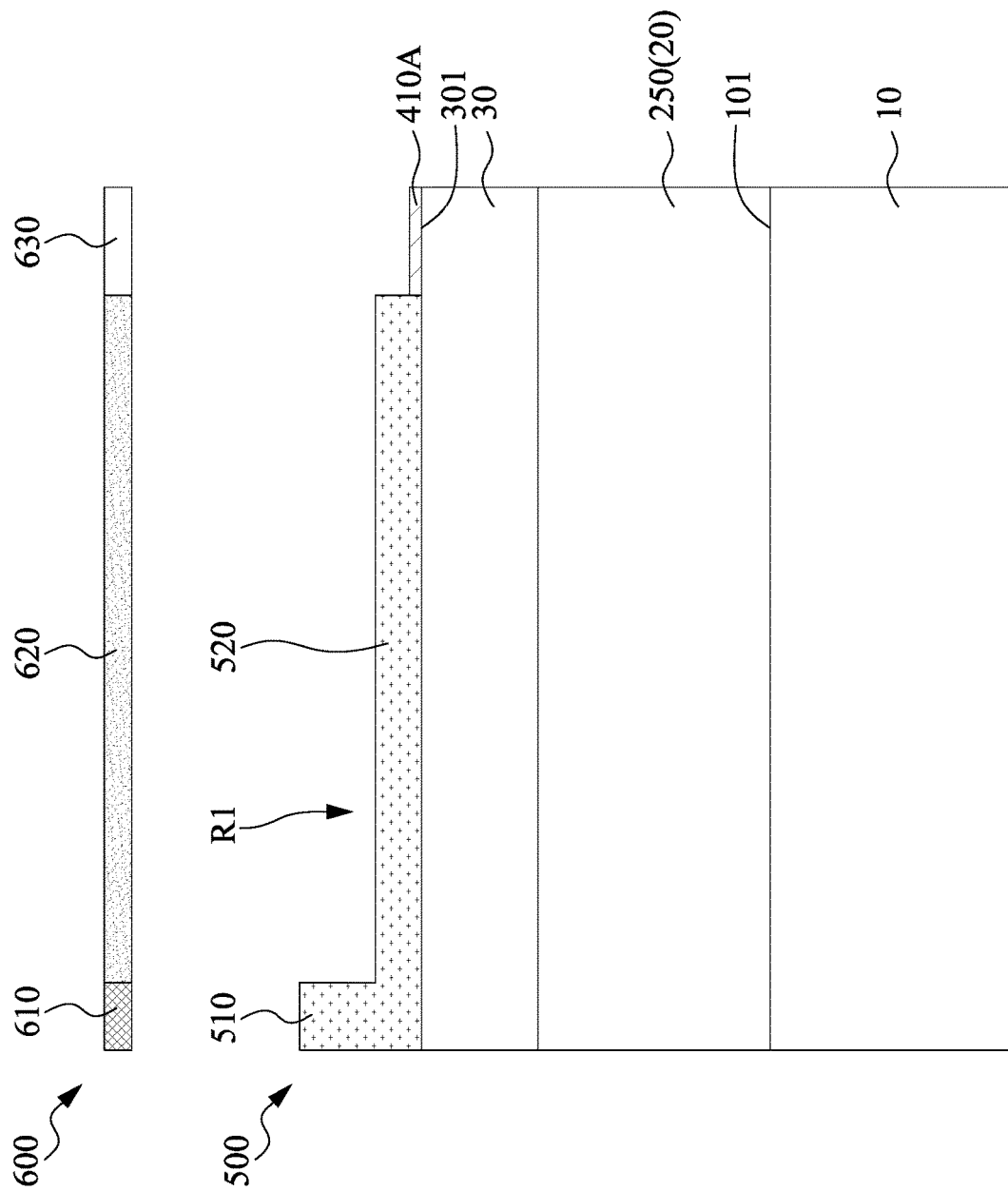
FIG. 6A illustrates one stage of a method of manufacturing a semiconductor device, in accordance with some embodiments of the present disclosure.
Figure 6B:
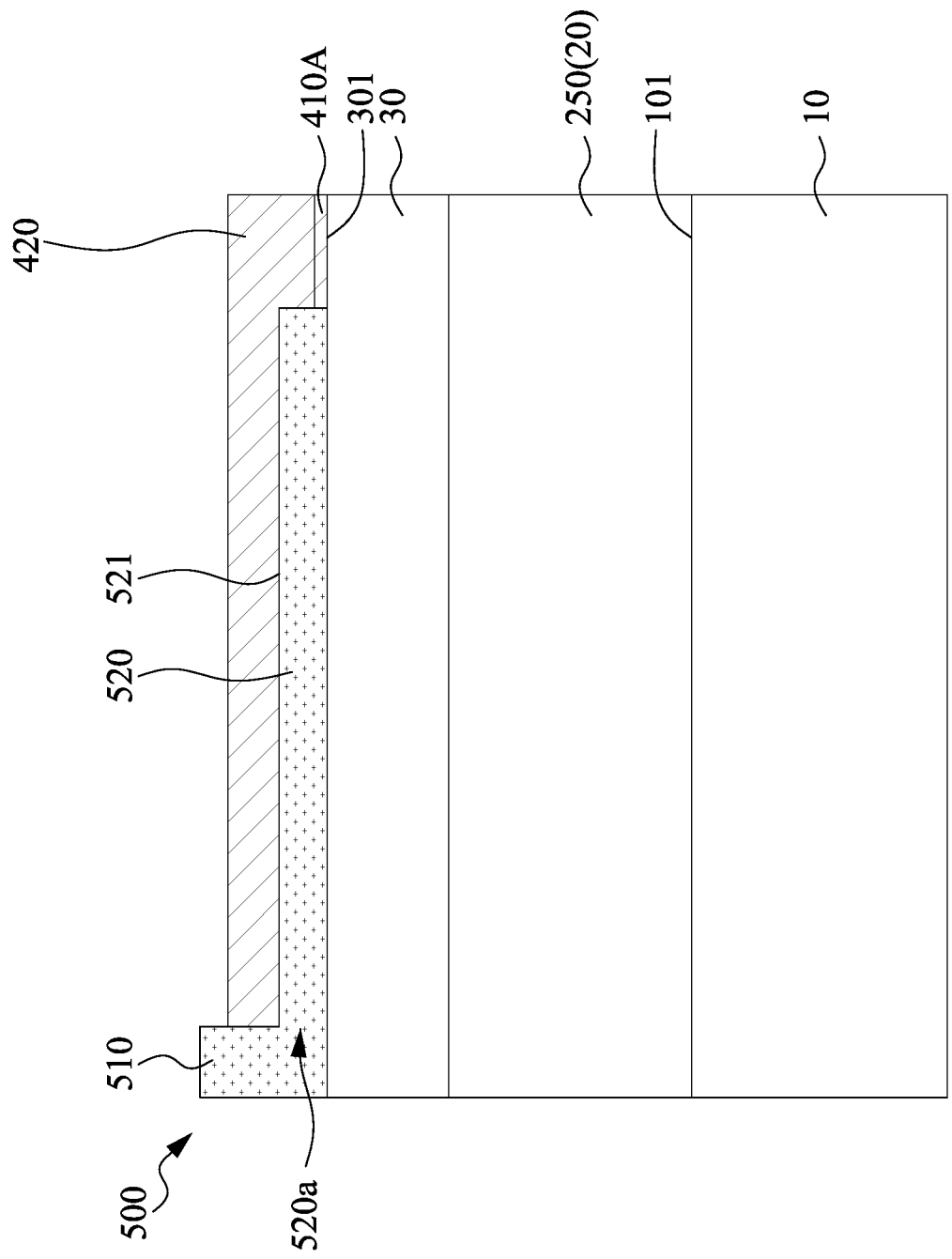
FIG. 6B illustrates one stage of a method of manufacturing a semiconductor device, in accordance with some embodiments of the present disclosure.
Figure 6C:
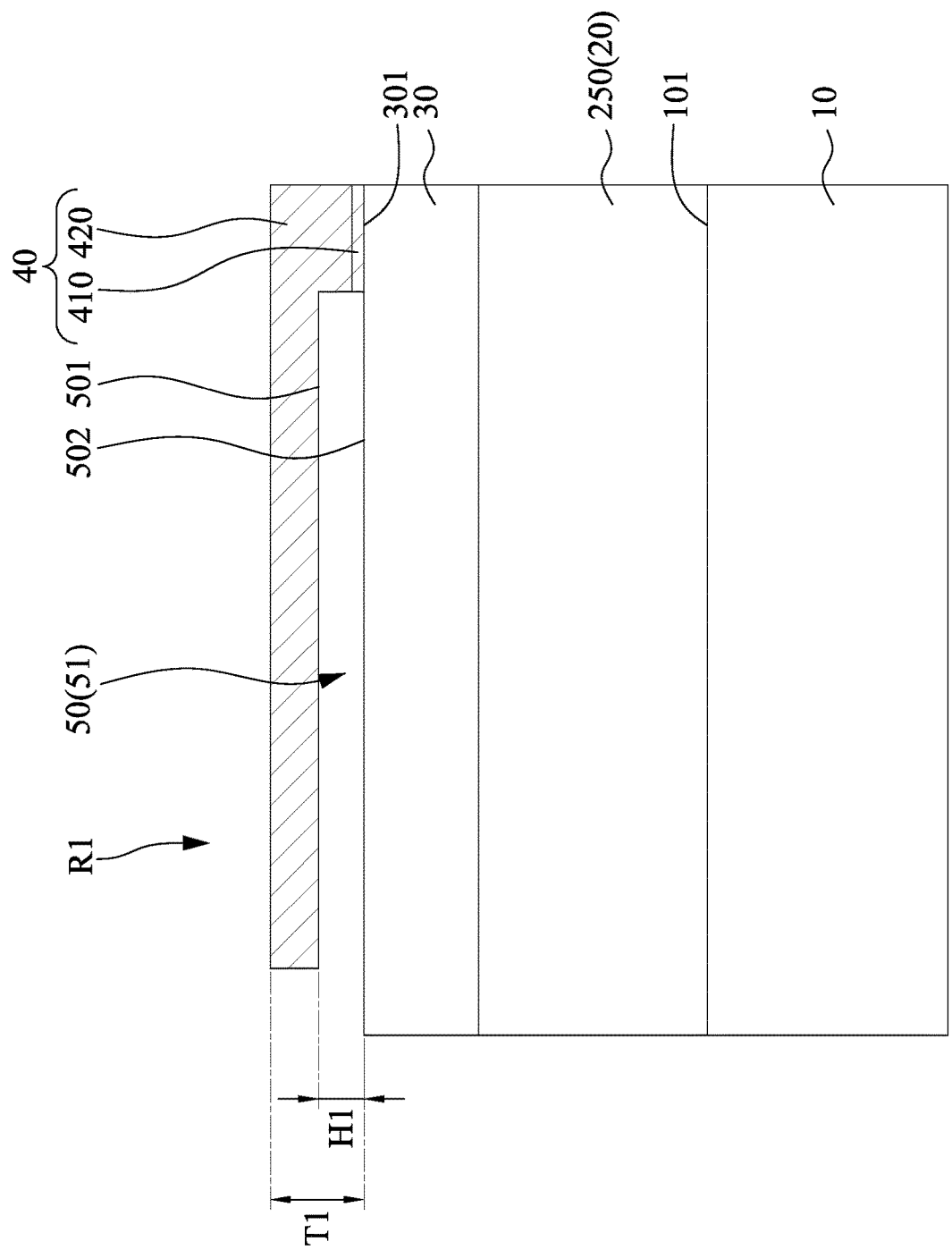
FIG. 6C illustrates one stage of a method of manufacturing a semiconductor device, in accordance with some embodiments of the present disclosure.
Figure 6D:
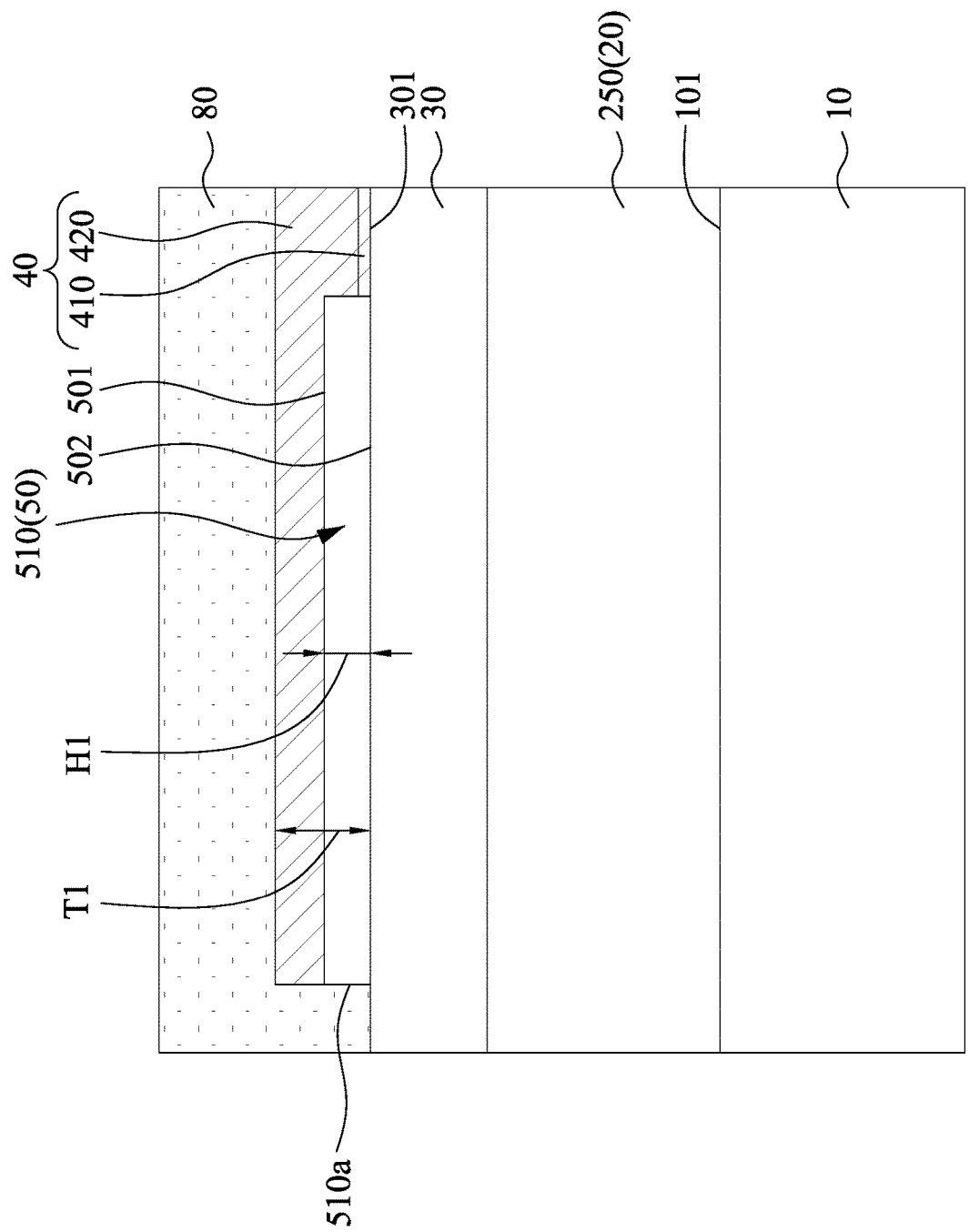
FIG. 6D illustrates one stage of a method of manufacturing a semiconductor device, in accordance with some embodiments of the present disclosure.

FIG. 6A, FIG. 6B, and FIG. 6C, illustrate various stages of a method of manufacturing a semiconductor device, in accordance with some embodiments of the present disclosure.

FIG. 6A shows one or more stages of manufacturing a semiconductor device along the cross-sectional line C-C' in FIG. 3, in accordance with some embodiments of the present disclosure.

Referring to FIG. 3 and FIG. 6A, an interconnection structure 20 may be provided or formed on a substrate 10, and a dielectric layer 30 may be formed on the interconnection structure 20.

In some embodiments, a seed layer material 410A is formed on the dielectric layer 30, and a sacrificial layer 500 including patterns 510 and 520 is formed on the dielectric layer 30. In some embodiments, the pattern 510 has a thickness 510T, the pattern 520 (or the sacrificial pattern) has a thickness 520T, and the thickness 520T is smaller than the thickness 510T.

In some embodiments, the pattern 510 of the sacrificial layer 500 defines a predetermined region R1 on the dielectric layer 30, and predetermined region R1 is predetermined for a patterned conductive layer 40 to be formed therein in subsequent operations. In some embodiments, the pattern 520 entirely overlaps the predetermined region R1 defined by the pattern 510. In some embodiments, the pattern 520 is within the predetermined region R1 defined by the pattern 510.

In some embodiments, the sacrificial layer 500 may be formed by the following operations. In some embodiments, a sacrificial material is formed on the dielectric layer 30 and the seed layer material 410A. In some embodiments, a photomask 600 is provided over the sacrificial material, and the photomask 600 has a blocking region 610, an opaque region 620, and a clear region 630. In some embodiments, the blocking region 610 is configured to block exposing radiation from passing through, the opaque region 620 is configured to allow exposing radiation to partially pass through, and the clear region 630 is configured to allow exposing radiation to pass through. In some embodiments, the blocking region 610 is formed of or includes a light-blocking material or a light-absorbing material. In some embodiments, the opaque region 620 is formed of or includes a material that is substantially opaque to the radiation of a predetermined wavelength to be used for exposure. In some embodiments, the material of the opaque region 620 includes, for example, chromium or chromium oxide. In some embodiments, the clear region 630 is formed of or includes a material that is substantially transparent to the radiation of a predetermined wavelength to be used for exposure.

In some embodiments, a photolithography operation is performed on the sacrificial material according to the photomask 600 to form the sacrificial layer 500 including the patterns 510 and 520. In some embodiments, the pattern 510 is formed directly under the blocking region 610 of the photomask 600 by performing the photolithography operation. In some embodiments, a portion of the sacrificial material directly under the opaque region 620 of the photomask 600 is partially removed by performing the photolithography operation, so as to form the pattern 520 directly under the opaque region 620 of the photomask 600. In some embodiments, a portion of the sacrificial material directly under the clear region 630 of the photomask 600 is completely removed by performing the photolithography operation. In some embodiments, a portion of the seed layer material 410A is exposed by the sacrificial layer 500 and directly under the clear region 630 of the photomask 600. In some embodiments, a portion of the seed layer material 410A in the predetermined region R1 is exposed by the sacrificial layer 500. In some embodiments, the pattern 510 directly connects to the pattern 520.

FIG. 6B shows one or more stages of manufacturing a semiconductor device along the cross-sectional line C-C' in FIG. 3, in accordance with some embodiments of the present disclosure.

Referring to FIG. 3 and FIG. 6B, a conductive layer 420 may be formed on the seed layer material 410A and the pattern 520 of the sacrificial layer 500. In some embodiments, the conductive layer 420 is formed within the predetermined region R1. In some embodiments, the conductive layer 420 is formed by plating. In some embodiments, the conductive layer 420 is not formed on the pattern 510 of the sacrificial layer 500.

In some embodiments, after the conductive layer 420 is formed on the pattern 520, a portion 520a of the pattern 520 is exposed from the conductive layer 420. In some embodiments, the portion 520a directly connects to the pattern 510.

FIG. 6C shows one or more stages of manufacturing a semiconductor device along the cross-sectional line C-C' in FIG. 3, in accordance with some embodiments of the present disclosure.

Referring to FIG. 3 and FIG. 6C, the pattern 520 of the sacrificial layer 500 may be removed to form an air cavity 50 within the conductive layer 420. In some embodiments, the pattern 510 of the sacrificial layer 500 is also removed. In some embodiments, the pattern 510 and the pattern 520 of the sacrificial layer 500 are removed in the same operation. In some embodiments, the conductive layer 420 is exposed to the air cavity 50. In some embodiments, the pattern 510 and the pattern 520 of the sacrificial layer 500 are removed by a photoresist striping operation. In some embodiments, the pattern 510 and the pattern 520 of the sacrificial layer 500 are removed by a removal solution.

In some embodiments, a portion of the seed layer material 410A exposed from the conductive layer 420 may be removed, so as to form a patterned conductive layer 40 including the seed layer 410 and the conductive layer 420. In some embodiments, the patterned conductive layer 40 is formed within the predetermined region R1. In some embodiments, the air cavity 50 is formed within the patterned conductive layer 40.

Next, referring to FIG. 3 and FIG. 4C, a dielectric layer 80 may be formed on the patterned conductive layer 40. As such, the semiconductor device 3 as illustrated in FIG. 4C is formed.

Figure 7:
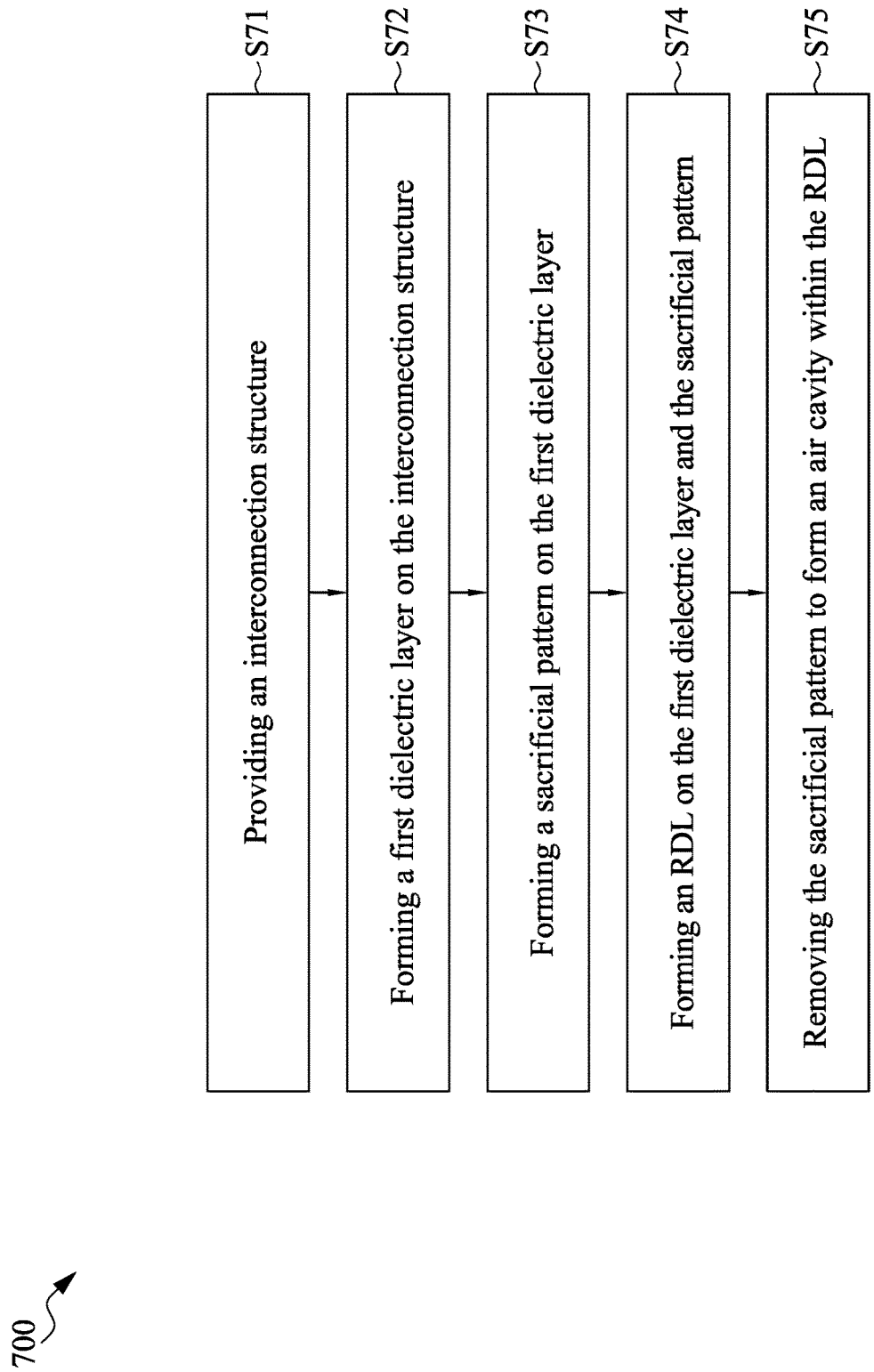
FIG. 7 is a flowchart illustrating a method of manufacturing a semiconductor device, in accordance with some embodiments of the present disclosure.

FIG. 7 is a flowchart illustrating a method 700 of manufacturing a semiconductor device, in accordance with some embodiments of the present disclosure.

The method 700 begins with operation S71 in which an interconnection structure is provided.

The method 700 continues with operation S72 in which a first dielectric layer is formed on the interconnection structure.

The method 700 continues with operation S73 in which a sacrificial pattern is formed on the first dielectric layer.

The method 700 continues with operation S74 in which an RDL is formed on the first dielectric layer and the sacrificial pattern.

The method 700 continues with operation S75 in which the sacrificial pattern is removed to form an air cavity within the RDL.

The method 700 is merely an example, and is not intended to limit the present disclosure beyond what is explicitly recited in the claims. Additional operations can be provided before, during, or after each operations of the method 700, and some operations described can be replaced, eliminated, or moved around for additional embodiments of the method. In some embodiments, the method 700 can include further operations not depicted in FIG. 7. In some embodiments, the method 700 can include one or more operations depicted in FIG. 7.

Figure 8:
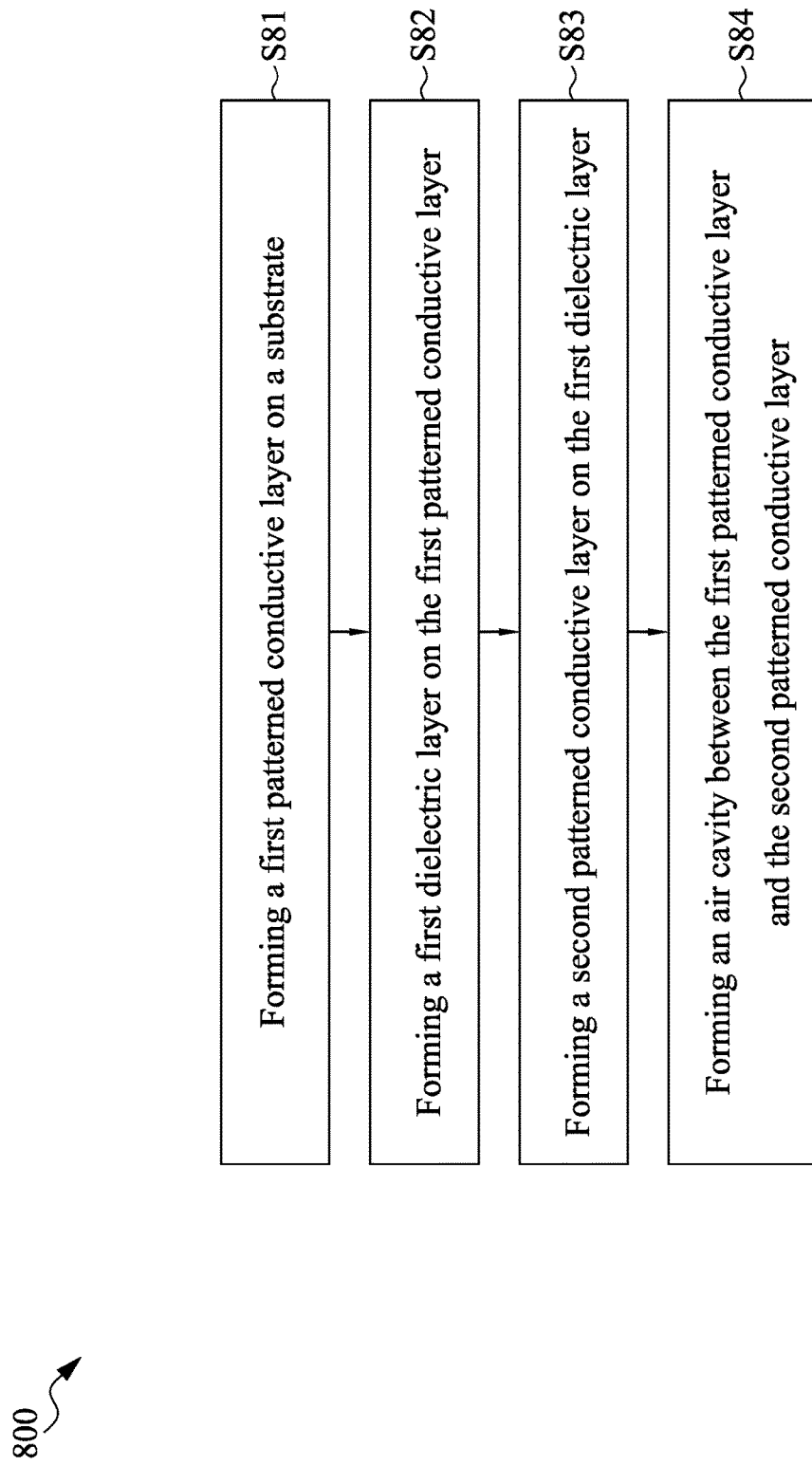
FIG. 8 is a flowchart illustrating a method of manufacturing a semiconductor device, in accordance with some embodiments of the present disclosure.

FIG. 8 is a flowchart illustrating a method 800 of manufacturing a semiconductor device, in accordance with some embodiments of the present disclosure.

The method 800 begins with operation S81 in which a first patterned conductive layer is formed on a substrate.

The method 800 continues with operation S82 in which a first dielectric layer is formed on the first patterned conductive layer.

The method 800 continues with operation S83 in which a second patterned conductive layer is formed on the first dielectric layer.

The method 800 continues with operation S84 in which an air cavity is formed between the first patterned conductive layer and the second patterned conductive layer.

The method 800 is merely an example, and is not intended to limit the present disclosure beyond what is explicitly recited in the claims. Additional operations can be provided before, during, or after each operations of the method 800, and some operations described can be replaced, eliminated, or moved around for additional embodiments of the method. In some embodiments, the method 800 can include further operations not depicted in FIG. 8. In some embodiments, the method 800 can include one or more operations depicted in FIG. 8.

One aspect of the present disclosure provides a semiconductor device. The semiconductor device includes a substrate, a first patterned conductive layer, a first dielectric layer, and a second patterned conductive layer. The first patterned conductive layer is on the substrate. The first dielectric layer is on the first patterned conductive layer. The second patterned conductive layer is on the first dielectric layer. The semiconductor device has an air cavity between the first patterned conductive layer and the second patterned conductive layer.

Another aspect of the present disclosure provides a semiconductor device. The semiconductor device includes an interconnection structure, a first dielectric layer, and a redistribution layer (RDL). The interconnection structure includes a top patterned conductive layer. The first dielectric layer is on the top patterned conductive layer. The RDL is on the first dielectric layer. The semiconductor device has an air gap between the RDL and the interconnection structure.

Another aspect of the present disclosure provides a method of manufacturing a semiconductor device. The method includes providing an interconnection structure. The method also includes forming a first dielectric layer on the interconnection structure. The method further includes forming a sacrificial pattern on the first dielectric layer. The method also includes forming an RDL on the first dielectric layer and the sacrificial pattern. The method further includes removing the sacrificial pattern to form an air cavity within the RDL.

In the semiconductor device, with the design of the air cavity, the parasitic capacitance resulted from the interconnection structure, the dielectric layer, and the patterned conductive layer (or the RDL) can be significantly reduced, and thus the operation performance of the semiconductor device can be improved.

Although the present disclosure and its advantages have been described in detail, it should be understood that various changes, substitutions and alterations can be made herein without departing from the spirit and scope of the disclosure as defined by the appended claims. For example, many of the processes discussed can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, comprising:
   forming a first dielectric layer over a substrate;
   forming a sacrificial pattern on a top surface of the first dielectric layer;
   forming an RDL on the top surface of the first dielectric layer and the sacrificial pattern, wherein a top surface and two side surfaces of the sacrificial pattern are in contact with the RDL, such that the sacrificial pattern is enclosed in the RDL; and
   removing the sacrificial pattern to form an air cavity enclosed within the RDL, wherein a top surface and two side surfaces of the air cavity are defined and enclosed by the RDL.

2. The method of claim 1, wherein forming the sacrificial pattern comprises:
   forming a sacrificial layer on the first dielectric layer, the sacrificial layer comprising a first pattern having a first thickness and the sacrificial pattern having a second thickness smaller than the first thickness.

3. The method of claim 2, wherein the first pattern of the sacrificial layer defines a predetermined region on the first dielectric layer, and the RDL is formed within the predetermined region.

4. The method of claim 3, wherein the sacrificial pattern entirely overlaps the predetermined region defined by the first pattern.

5. The method of claim 2, further comprising removing the first pattern of the sacrificial layer, wherein the first pattern and the sacrificial pattern are removed in a same operation.

6. The method of claim 1, wherein forming the sacrificial pattern comprises:
   forming a sacrificial material on the first dielectric layer;
   providing a photomask over the sacrificial material, the photomask having a blocking region and an opaque region; and
   performing a photolithography operation on the sacrificial material according to the photomask to form the sacrificial pattern directly under the opaque region of the photomask.

7. The method of claim 6, wherein after the RDL is formed on the sacrificial pattern, a portion of the sacrificial pattern is exposed from the RDL.

8. The method of claim 7, wherein performing the photolithography operation further forms a first pattern directly under the blocking region of the photomask, wherein the first pattern directly connects to the sacrificial pattern.

9. The method of claim 1, wherein the sacrificial pattern comprises a photoresist material.

10. The method of claim 6, wherein forming the RDL comprises:
    forming a seed layer on the first dielectric layer; and
    forming a conductive layer on the seed layer, wherein the conductive layer is exposed to the air cavity.

11. The method of claim 1, wherein a bottom surface of the air cavity is coplanar with a bottom surface of the RDL.

12. The method of claim 1, wherein a thickness of the RDL is greater a height of the air cavity.

* * * * *